(12) United States Patent
Hodge et al.

(10) Patent No.: US 7,355,848 B1
(45) Date of Patent: Apr. 8, 2008

(54) SYSTEM AND METHOD FOR REMOVING HEAT FROM A SUBSCRIBER OPTICAL INTERFACE

(75) Inventors: Ronald L. Hodge, Flowery Branch, GA (US); James O. Farmer, Lilburn, GA (US)

(73) Assignee: Wave7 Optics, Inc., Alpharetta, GA (US)

( * ) Notice: Subject to any disclaimer, the term of this patent is extended or adjusted under 35 U.S.C. 154(b) by 12 days.

(21) Appl. No.: 11/147,740

(22) Filed: Jun. 8, 2005

Related U.S. Application Data

(62) Division of application No. 10/337,620, filed on Jan. 7, 2003, now Pat. No. 7,038,910.

(60) Provisional application No. 60/344,805, filed on Jan. 7, 2002.

(51) Int. Cl.
*H05K 7/20* (2006.01)

(52) U.S. Cl. ............... 361/690; 165/185; 174/52.1; 174/59; 361/704; 361/707; 361/715; 361/752; 361/730; 454/184

(58) Field of Classification Search ............ 361/694, 361/695, 690; 454/184
See application file for complete search history.

(56) References Cited

U.S. PATENT DOCUMENTS

| | | | |
|---|---|---|---|
| 4,253,035 A | 2/1981 | Amitay | |
| 4,295,005 A | 10/1981 | Daugherty | |
| 4,495,545 A * | 1/1985 | Dufresne et al. | ........... 361/695 |
| 4,500,990 A | 2/1985 | Akashi | |
| 4,654,891 A | 3/1987 | Smith | |
| 4,665,517 A | 5/1987 | Widmer | |
| 4,733,398 A | 3/1988 | Shibagaki et al. | |
| 4,763,317 A | 8/1988 | Lehman et al. | |
| 4,805,979 A | 2/1989 | Bossard | |

(Continued)

FOREIGN PATENT DOCUMENTS

CA 2107922 4/1995

(Continued)

OTHER PUBLICATIONS

McDevitt et al., Switched vs Broadcast Video for Fiber-to-the Home Systems, Alcatel Network Systems, 1990, IEEE, CH2829-0/90/0000-1109, pp. 1109-1119.

(Continued)

*Primary Examiner*—Gregory D Thompson
(74) *Attorney, Agent, or Firm*—King & Spalding LLP

(57) ABSTRACT

A system and method removes heat from an enclosure or housing of a subscriber optical interface. When a subscriber optical interface housing is attached to a structure such that a partially enclosed volume of space remains between the structure and the subscriber optical interface housing, this partially enclosed volume of space can produce a chimney effect when heat from the subscriber optical interface housing is intended to flow from fins towards the structure. This chimney effect can refer to a fluid such as air within the partially enclosed space that is heated by the fins and that rises upward when the ambient or surrounding fluid is cooler relative to the heated fluid. According to another exemplary embodiment, the subscriber optical interface can be shaped to form an internal chimney structure that is entirely surrounded by a housing of the subscriber optical interface.

27 Claims, 12 Drawing Sheets

U.S. PATENT DOCUMENTS

| | | | |
|---|---|---|---|
| 4,852,023 A | 7/1989 | Lee et al. | |
| 4,945,541 A | 7/1990 | Nakayama | |
| 4,956,863 A | 9/1990 | Goss | |
| 4,975,899 A | 12/1990 | Faulkner | |
| 5,105,336 A | 4/1992 | Jacoby et al. | |
| 5,132,992 A | 7/1992 | Yurt et al. | |
| 5,144,267 A | 9/1992 | West, Jr. | |
| 5,179,591 A | 1/1993 | Hardy | |
| 5,189,725 A | 2/1993 | Bensel, III et al. | |
| 5,247,347 A | 9/1993 | Litteral et al. | |
| 5,249,194 A | 9/1993 | Sakanushi | |
| 5,253,250 A | 10/1993 | Schlafer et al. | |
| 5,253,275 A | 10/1993 | Yurt et al. | |
| 5,303,295 A | 4/1994 | West et al. | |
| 5,313,546 A | 5/1994 | Toffetti | |
| 5,325,223 A | 6/1994 | Bears | |
| 5,345,504 A | 9/1994 | West, Jr. | |
| 5,349,457 A | 9/1994 | Bears | |
| 5,365,585 A | 11/1994 | Puhl et al. | |
| 5,365,588 A | 11/1994 | Bianco et al. | |
| 5,378,174 A | 1/1995 | Brownlie | |
| 5,402,315 A | 3/1995 | Reichle | |
| 5,412,498 A | 5/1995 | Arstein et al. | |
| 5,432,875 A | 7/1995 | Korkowski et al. | |
| 5,469,507 A | 11/1995 | Canetti et al. | |
| 5,495,549 A | 2/1996 | Schneider | |
| 5,509,099 A | 4/1996 | Hermsen | |
| 5,510,921 A | 4/1996 | Takai et al. | |
| 5,528,455 A * | 6/1996 | Miles | 361/695 |
| 5,528,582 A | 6/1996 | Bodeep | |
| 5,534,912 A | 7/1996 | Kostreski | |
| 5,541,917 A | 7/1996 | Farris | |
| 5,550,863 A | 8/1996 | Yurt et al. | |
| 5,557,317 A | 9/1996 | Nishio et al. | |
| 5,559,858 A | 9/1996 | Beveridge | |
| 5,566,099 A | 10/1996 | Shimada | |
| 5,572,347 A | 11/1996 | Burton et al. | |
| 5,572,348 A | 11/1996 | Carlson | |
| 5,572,349 A | 11/1996 | Hale | |
| 5,666,487 A | 9/1997 | Goodman et al. | |
| 5,694,232 A | 12/1997 | Parsay et al. | |
| 5,701,186 A | 12/1997 | Huber | |
| 5,706,303 A | 1/1998 | Lawrence | |
| 5,715,020 A | 2/1998 | Kuroiwa et al. | |
| 5,731,546 A | 3/1998 | Miles et al. | |
| RE35,774 E | 4/1998 | Moura et al. | |
| 5,769,159 A * | 6/1998 | Yun | 165/276 |
| 5,778,017 A | 7/1998 | Sato et al. | |
| 5,790,523 A | 8/1998 | Ritchie, Jr. | |
| 5,793,413 A | 8/1998 | Hylton et al. | |
| 5,793,506 A | 8/1998 | Schmid | |
| 5,802,089 A | 9/1998 | Link | |
| 5,822,102 A | 10/1998 | Bodeep et al. | |
| 5,861,966 A | 1/1999 | Ortel | |
| 5,867,485 A | 2/1999 | Chambers et al. | |
| 5,875,430 A | 2/1999 | Koether | |
| 5,880,864 A | 3/1999 | Williams | |
| 5,892,865 A | 4/1999 | Williams | |
| 5,953,690 A | 9/1999 | Lemon | |
| 5,969,836 A | 10/1999 | Foltzer | |
| 5,974,063 A | 10/1999 | Yoshida | |
| 6,002,692 A | 12/1999 | Wills | |
| 6,002,720 A | 12/1999 | Yurt et al. | |
| 6,041,056 A | 3/2000 | Bigham et al. | |
| 6,097,159 A | 8/2000 | Mogi | |
| 6,097,515 A | 8/2000 | Pomp et al. | |
| 6,144,702 A | 11/2000 | Yurt et al. | |
| 6,151,343 A | 11/2000 | Jurgensen | |
| 6,167,553 A | 12/2000 | Dent | |
| RE37,125 E | 4/2001 | Carlson | |
| 6,215,939 B1 | 4/2001 | Cloud | |
| 6,229,701 B1 * | 5/2001 | Kung et al. | 361/688 |
| 6,295,148 B1 | 9/2001 | Atlas | |
| 6,300,562 B1 | 10/2001 | Daoud | |
| 6,330,155 B1 * | 12/2001 | Remsburg | 361/695 |
| 6,336,201 B1 | 1/2002 | Geile et al. | |
| 6,342,004 B1 * | 1/2002 | Lattimore et al. | 454/184 |
| 6,356,369 B1 | 3/2002 | Farhan | |
| 6,360,320 B1 | 3/2002 | Ishiguro et al. | |
| 6,385,366 B1 | 5/2002 | Lin | |
| 6,421,150 B2 | 7/2002 | Graves | |
| 6,424,656 B1 | 7/2002 | Hoebeke | |
| 6,427,035 B1 | 7/2002 | Mahony | |
| 6,460,182 B1 | 10/2002 | BuAbbud | |
| 6,463,068 B1 | 10/2002 | Lin et al. | |
| 6,483,635 B1 | 11/2002 | Wach | |
| 6,486,907 B1 | 11/2002 | Farber et al. | |
| 6,490,727 B1 | 12/2002 | Nazarathy et al. | |
| 6,496,641 B1 | 12/2002 | Mahony | |
| 6,507,494 B1 | 1/2003 | Hutchison et al. | |
| 6,546,014 B1 | 4/2003 | Kramer et al. | |
| 6,577,414 B1 | 6/2003 | Feldman | |
| 6,611,522 B1 | 8/2003 | Zheng et al. | |
| 6,621,975 B2 | 9/2003 | Laporte et al. | |
| 6,654,565 B2 | 11/2003 | Kenny | |
| 6,674,967 B2 | 1/2004 | Skrobko et al. | |
| 6,680,948 B1 | 1/2004 | Majd et al. | |
| 6,687,376 B1 | 2/2004 | Yamaguchi | |
| 6,687,432 B2 | 2/2004 | Schemmann et al. | |
| 6,707,024 B2 | 3/2004 | Miyamoto | |
| 6,738,983 B1 | 5/2004 | Rao et al. | |
| 6,740,861 B2 | 5/2004 | Matsuda | |
| 6,771,614 B1 | 8/2004 | Jones, IV et al. | |
| 6,775,137 B2 * | 8/2004 | Chu et al. | 361/696 |
| 6,778,785 B2 | 8/2004 | Imajo | |
| 6,804,256 B2 | 10/2004 | Chang | |
| 6,804,354 B1 | 10/2004 | Driscoll | |
| 6,807,188 B1 | 10/2004 | Blahut et al. | |
| 6,823,385 B2 | 11/2004 | McKinnon, III et al. | |
| 6,889,007 B1 | 5/2005 | Wang et al. | |
| 6,973,271 B2 | 12/2005 | Farmer et al. | |
| 7,007,297 B1 | 2/2006 | Woodward | |
| 2001/0002195 A1 | 5/2001 | Fellman | |
| 2001/0002196 A1 | 5/2001 | Fellman | |
| 2001/0002486 A1 | 5/2001 | Fellman | |
| 2001/0004362 A1 | 6/2001 | Kamiya | |
| 2001/0030785 A1 | 10/2001 | Pangrac | |
| 2002/0006197 A1 | 1/2002 | Carroll et al. | |
| 2002/0012138 A1 | 1/2002 | Graves | |
| 2002/0021465 A1 | 2/2002 | Moore, Jr. | |
| 2002/0027928 A1 | 3/2002 | Fang | |
| 2002/0039218 A1 | 4/2002 | Farmer | |
| 2002/0063924 A1 | 5/2002 | Kimbrough et al. | |
| 2002/0089725 A1 | 7/2002 | Farmer | |
| 2002/0105965 A1 | 8/2002 | Dravida et al. | |
| 2002/0116719 A1 | 8/2002 | Dapper et al. | |
| 2002/0135843 A1 | 9/2002 | Gruia | |
| 2002/0141159 A1 | 10/2002 | Bloemen | |
| 2002/0164026 A1 | 11/2002 | Huima | |
| 2002/0181925 A1 | 12/2002 | Hodge et al. | |
| 2003/0007210 A1 | 1/2003 | Kenny | |
| 2003/0007220 A1 | 1/2003 | Whittlesey et al. | |
| 2003/0011849 A1 | 1/2003 | Farmer et al. | |
| 2003/0016692 A1 | 1/2003 | Thomas et al. | |
| 2003/0072059 A1 | 4/2003 | Thomas et al. | |
| 2003/0086140 A1 | 5/2003 | Thomas et al. | |
| 2003/0090320 A1 | 5/2003 | Skrobko et al. | |
| 2003/0128983 A1 | 7/2003 | BuAbbud et al. | |
| 2003/0154282 A1 | 8/2003 | Horvitz | |
| 2003/0189587 A1 | 10/2003 | White et al. | |
| 2003/0194241 A1 | 10/2003 | Farmer | |
| 2003/0206564 A1 | 11/2003 | Mills et al. | |
| 2003/0223750 A1 | 12/2003 | Farmer et al. | |
| 2004/0086277 A1 | 5/2004 | Kenny | |

| | | | |
|---|---|---|---|
| 2004/0131357 | A1 | 7/2004 | Farmer et al. |
| 2004/0141747 | A1 | 7/2004 | Kenny et al. |
| 2004/0161217 | A1 | 8/2004 | Hodge et al. |
| 2004/0199502 | A1 | 10/2004 | Wong et al. |
| 2004/0221088 | A1 | 11/2004 | Lisitsa et al. |
| 2004/0253003 | A1 | 12/2004 | Farmer et al. |
| 2004/0264492 | A1 | 12/2004 | Blahut |
| 2004/0267730 | A1 | 12/2004 | Dumais et al. |
| 2005/0053350 | A1 | 3/2005 | Hodge et al. |
| 2005/0074241 | A1 | 4/2005 | Farmer et al. |
| 2005/0081244 | A1 | 4/2005 | Barrett et al. |
| 2005/0123001 | A1 | 6/2005 | Craven et al. |
| 2005/0125837 | A1 | 6/2005 | Farmer et al. |
| 2005/0175035 | A1 | 8/2005 | Neely et al. |
| 2006/0020975 | A1 | 1/2006 | Kenny et al. |
| 2006/0039699 | A1 | 2/2006 | Farmer et al. |
| 2006/0075428 | A1 | 4/2006 | Farmer et al. |

FOREIGN PATENT DOCUMENTS

| | | |
|---|---|---|
| EP | 0713347 | 5/1996 |
| EP | 0720322 | 7/1996 |
| EP | 0 566 662 | 11/1999 |
| EP | 0955739 | 11/1999 |
| EP | 0 933 892 | 10/2003 |
| JP | 07-020327 | 1/1995 |
| JP | 10-020123 | 1/1998 |
| JP | 11-305052 | 11/1999 |
| JP | 4-504433 | 3/2002 |
| MX | 180038 | 11/1995 |
| TW | 72821 | 8/1995 |
| WO | WO 01/27940 | 4/2001 |
| WO | WO 02/030019 | 4/2002 |
| WO | WO 02/30020 | 4/2002 |
| WO | WO 02/060123 | 8/2002 |
| WO | WO 03/001737 | 1/2003 |
| WO | WO 03/005611 | 1/2003 |
| WO | WO 03/005612 | 1/2003 |
| WO | WO 03/019243 | 3/2003 |
| WO | WO 03/021820 | 3/2003 |
| WO | WO 03/023980 | 3/2003 |
| WO | WO 03/079567 | 9/2003 |
| WO | WO 03/090396 | 10/2003 |
| WO | WO 06/014433 | 2/2006 |
| WO | WO 06/020538 | 2/2006 |
| WO | WO 06/041784 | 4/2006 |

OTHER PUBLICATIONS

Mangun et al., Fiber to the Home Experience in Southern Bell, BellSouth Services and Northern Telecom, 1988, IEEE, CH2536-1/88/0000-0208, pp. 208-212.
Han et al., Burst-Mode Penalty of AC- Coupled Optical Receivers Optimized for 8B/10B Line Code, 2004, IEEE.
Coppinger et al., Nonlinear Raman Cross-Talk in a Video Overlay Passive Optical Network, 2003, Tuesday Afternoon, OFC 2003, vol. 1, pp. 285-286.
Piehler et al., Nonlinear Raman Crosstalk in a 125-Mb/s CWDM Overlay on a 1310-nm Video Access Network, 2003, Optical Society of America.
Wong et al., 50-dB Nonlinear Crosstalk Suppression in a WDM Analog Fiber System by Complementary Modulation and Balanced Detection, 2003, IEEE, pp. 500-505.
Perkins, The Art of Overlaying Video Services on a BPON, 2004, Bechtel Corporation, pp. 1-9.
"Trading Update and Operational Review Presentation" Marconi, Sep. 4, 2001, pp. 1-35.
"Cable Market" 2 pgs, Marconi Corporation, PLC, 2000 at www.Marconi.com..
"Communications" 2 pgs, Marconi Corporation, PLC, 2000 at www.Marconi.com.
"Dalton Utilities" 9 pgs, Marconi Corporation, PLC, 2002 at www.Marconi.com.
"Deep Fiber Solutions" 3 pgs, Marconi Corporation, PLC, 2000 at www.Marconi.com.
"Deep Fiber HFC Features and Benefits" 1 pg, Marconi Corporation, PLC, 2002 at www.Marconi.com.
"Deep Fiber HFC Network Diagram" 1 pg, Marconi Corporation, PLC, 2002 at www.Marconi.com.
"Deep Fiber HFC Product Overview: New FITL Configuration" 2 pgs, Marconi Corporation, PLC, 2002 at www.Marconi.com.
"Deep Fiber HFC Technical Specifications" 2 pgs, Marconi Corporation, PLC, 2002 at www.Marconi.com.
"Deep Fiber HFC—New FITL Configuration" 1 pg, Marconi Corporation, PLC, 2002 at www.Marconi.com.
"En-Touch" at 5 pgs, Marconi Corporation, PLC, 2002 www.Marconi.com.
"Fiber to the Home" International Engineering Consortium (no date) pp. 1-10, available at www.iec.com.
"Deep Fiber HFC" Marconi Corporation PLC 2000, pp. 1-2.
"Integrated Voice, Video and Data Services Over a Single Fiber: A Compelling Opportunity for Cable Operators" Marconi Corporation PLC, May 2000, 6 pgs.
"Deep Fiber Solutions: Advanced Broadband Services" Marconi Corporation PLC, May 2000, 5 pgs.
"Deep Fiber HFC: A Next-Generation Integrated Access Solution Offering Significant Improvement Over Traditional HFC Architectures" Marconi Corporation PLC, May 2000, 8 pgs.
"A Gold Mine of Opportunities in the Face of Increasing Competition: Choices for Utilities Entering the Communications Marketplace" Marconi Corporation PLC, May 2000, 6 pgs.
"Fiber Optics on New Development MDUs: A Research Summary," Marconi Corporation PlC May 2000 5 pgs.
"Thermal Management Challenges; Small ONU Enclosures," Marconi Corporation PLC, May 2000, 9 pgs.
"Passive Optical Networks— Is There Light at the End of the Access Tunnel?" CIBC World Markets Inc., Jan. 11, 2001, pp. 1-66.
"36.2.4 8B/10B transmission code", IEEE 2000, pp. 966-969.
Khoe, G. et al., "Coherent Multicarrier Technology for Implementation in the Customer Access," IEEE, May/Jun. 1993, pp. 695-713.
Linnell, L. "A Wide-Band Local Access System Using Emerging-Technology Components," IEEE, Jul. 1986, pp. 612-618.
"Digital Broadband Delivery System: Out of Band Transport—Mode B," Society of Cable Telecommunications Engineers, Inc., Aug. 10, 1998, 76 pgs.
"Digital Broadband Delivery System: Out of Band Transport—Mode A," Society of Cable Telecommunications Engineers, Inc., Aug. 26, 1998, 49 pgs.
Gaglianello, B., "An Efficient MAC Layer Protocol for EPON," IEEE 802.3 EFM Nov. 2001, 9 pgs.
"Policing and Shaping Overview" *Quality of Service Solutions Configuration Guide*, Cisco Systems, Inc. (No Date).
Cisco IOS™ Software Quality of Service Solutions, Cisco Systems, Inc. 1998, 28 pgs.
International Search Report for PCT/US01/21298, 2 pgs, mailed Jun. 17, 2002.
International Search Report for PCT/US02/03056, 1 pg, mailed Jun. 12, 2002.
"Ethernet— Accelerating the Standard for Speed," 7 pgs, Gigabit Ethernet Alliance, Nov. 2000 www.gigabit-ethernet.org.
"eLuminant— Asynchronous Transfer Mode (ATM) Passive Optical Networks (PONS) Tutorial" 28 pgs, International Engineering Consortium, 2000 at www.iec.org.
International Search Report dated Dec. 4, 2002 for PCT/US02/27398.
International Search Report dated Dec. 17, 2002 for PCT/US02/15861.
Global Access™ , Universal Services Gateway, USG100, ARRIS, pp. 1-2, Oct. 18, 2002.
Global Access™ , Universal Access Switch, UA4024, ARRIS, pp. 1-2, Aug. 28, 2002.
Partial International Search Report dated Jan. 3, 2003 for PCT/US01/31032.
International Search Report date Apr. 22, 2003 for PCT/US01/50361.

Zhang, L. et al., "Label-switching architecture for IP traffic over WDM networks", IEE Proc. —Commun., vol. 147, No. 5, Oct. 2000, pp. 269-275.

Masip-Torne, J. et al., "Providing Difrerentiated Service Categories in Optical Packet Networks", Proceedings of the International Teletraffic Congress, 1999. ITC-16. Teletraffic Engineering in a Competitive World. Edinburgh, UK, Jun. 7-11, 1999, Teletraffic Science and Engineering Amsterdam: Elsevier, NL, vol. 3B, Jun. 7, 1999, pp. 1115-1126.

Bannister, J. et al., "how Many Wavelengths Do We Really Need? A Study of the Performance Limits of Packet Over WaveLengths", Optical Networks Magazin, SPIE, Bellingham, WA, vol. 1, No. 2, Apr. 2000, pp. 17-28.

Yang, O.W.W. et al., "All-Optical WDM/TDM Star-Bus Network Using Optical Amplifiers", Journal of Optical Communications, Fachverlage Schiele & Schon, Berlin, DE, vol. 16, No. 6, Dec. 1, 1995, pp. 216-226.

Ciciora, Walter et al., "Modern Cable Television Technology: Video, Voice, and Data Communications", © 1999 by Morgan Kaufman Publishers Inc., pp. 167-176.

International Search Report dated Apr. 21, 2003 for PCT/US02/28734.

International Search Report dated Jul. 2, 2003 for PCT/US03/07814.

Angelopoulos J.D. et al, "A Transparent Mac Method for Bandwidth Sharing and CDV Control at the ATM Layer of Passive Optical Networks", Journal of Lightwave Technology, IEEE. New York, US, vol. 14, No. 12, Dec. 1, 1996, pp. 2625-2634, XP000642251 ISSN: 0733-8724.

Optical Networks Daily, A Publication of Optical Keyhole, Aug. 26, 2003, pp. 1-13.

International Search Report dated Jul. 7, 2003 for PCT/US01/51350.

International Search Report dated Oct. 3, 2003 for PCT/US03/12231.

Glaesemann, G. et al., "The Mechanical Reliability of Corning® Optical Fiber in Bending White Paper," Sep. 2002, pp. 1-4.

Corning® SMF-28™ Optical Fiber Information, Corning® Single Mode Optical Fiber, Apr. 2002, pp. 1-4.

Bourne, J. "Heathrow—Experience and Evolution"IEEE. 1990, pp. 1091-1095.

Miki, T. "A Design Concept on Fiber-Optic Wavelength-Division-Multiplexing Subscriber Loop System" WTG—Fachber. 1980, pp. 41-45.

Yamaguchi, K. "A Broadband Access Network Based on Optical Signal Processing: The Photonic Highway" IEEE. 1990, pp. 1030-1037.

Ciciora, Walter S. et al., "Modern Cable Television Technology: Video, Voice, and Data Communications", © 1999, pp. 162-214, Chapter 4, Morgan Kaufman Publishers, Inc., San Francisco, California.

Companie Deutsch, Components for Fiber Optics, "Triplexers—WDM: FSAN—TPM Series", pp. 1-6.

CEDaily Direct News, "Today's Report", Mar. 19, 2001, pp. 1-5.

Lucent Technologies, "Lucent Technologies Introduces Single-Fiber Network Access Devices for Voice, Video,and Data Services to the Home or Curb", Jun. 6, 2000, pp. 1-2.

Lucent Technologies, "Agere Systems Introues Single-Fiber Network Access Devices for Voice, Video and Data Services to the Home or Curb", Mar. 19, 2001, pp. 1-3.

Effenberger et al., "G.983.VideoReturnPath," Oct. 2004, International Telecommunication Union, Telecommunication Standardization Sector, Study Group 15—Contribution 13, pp. 1-18.

Fludger et al., "Pump to Signal RIN Transfer in Raman Fiber Amplifiers", Journal of Lightwave Technology, IEEE, New York, US, vol. 19, No. 8, Dec. Aug. 2001, pp. 1140-1148, ISSN: 0733-8724.

Tian et al., "Raman Crosstalk in Fiber-Optic Hybrid CATV Systems with Wide Channel Separations," IEEE Phtonics Tech Letters, Jan. 2004, pp. 344-346, vol. 16.

"Spectral Grids for WDM Applications: CWDM Wavelength Grid", International Telecommunication Union, ITU-T, Rec. G.694.2, Dec. 2003, pp. i-iii and pp. 1-4.

International Preliminary Examinatin Report of Nov. 19, 2003 for PCT/US03/07814.

International Preliminary Report on Patentability of Apr. 1, 2005 for PCT/US01/51350.

International Preliminary Examination Report of Sep. 17, 2004 for PCT/US03/12231.

International Search Report dated Apr. 18, 2006 for PCT/US05/23847.

Internationa Search Report dated Oct. 25, 2006 for PCT/US05/35512.

International Search Report dated Nov. 8, 2006 for PCT/US05/28020.

International Search Report dated Feb. 14, 206 for PCT/US05/46419.

International Search Report dated Feb. 26, 2007 for PCT/US06/11159.

\* cited by examiner

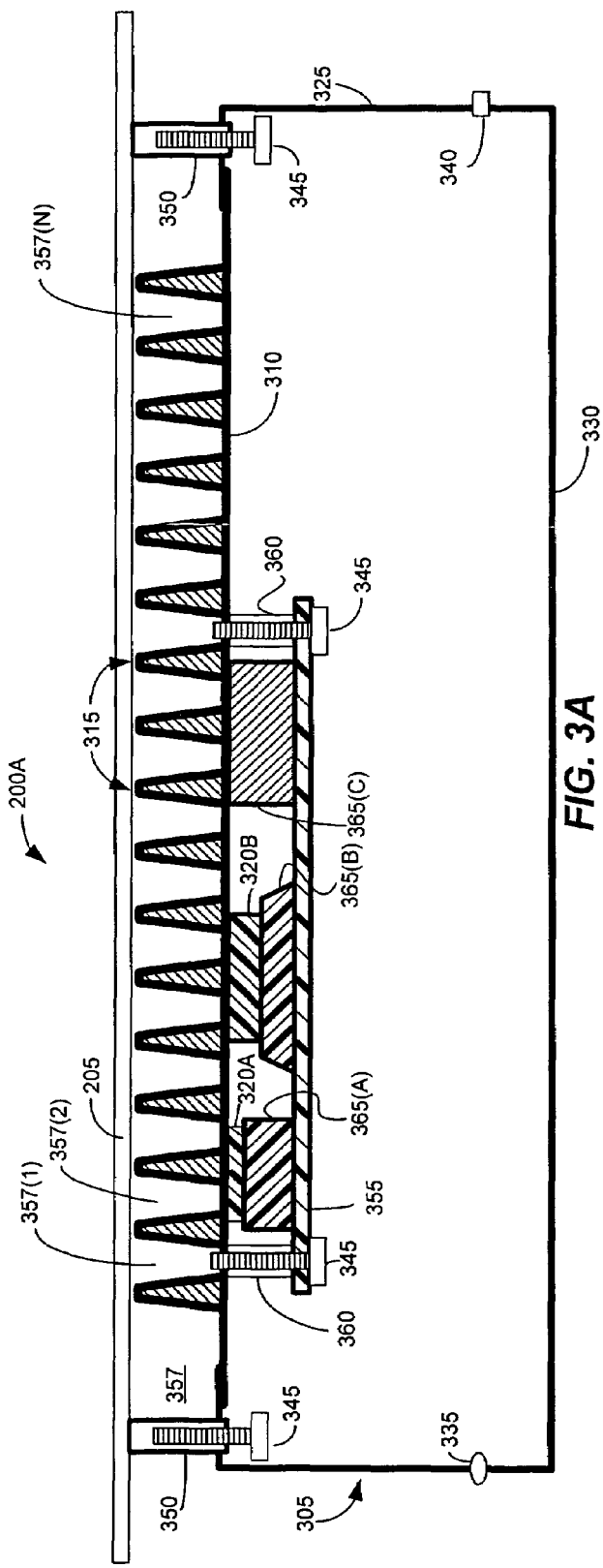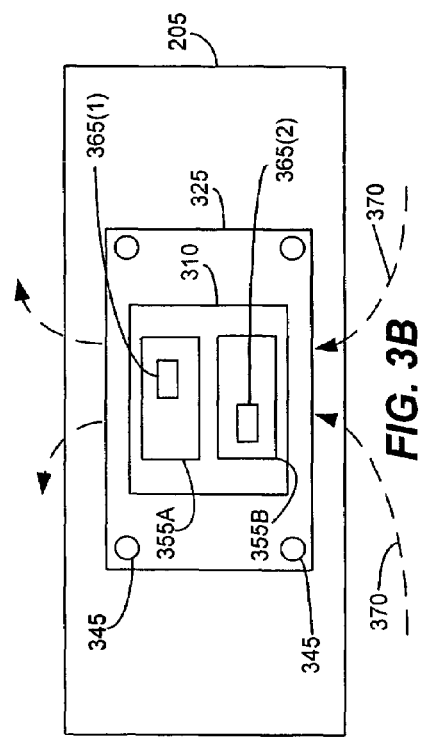
*FIG. 3A*
*FIG. 3B*

SYSTEM AND METHOD FOR REMOVING HEAT FROM A SUBSCRIBER OPTICAL INTERFACE

STATEMENT REGARDING RELATED APPLICATIONS

This application is a divisional of and claims priority to application Ser. No. 10/337,620 filed Jan. 7, 2003 now U.S. Pat. No. 7,038,910, entitled "System and Method for Removing Heat from a Subscriber Optical Interface," the entire contents of which are hereby incorporated by reference. U.S. patent application Ser. No. 10/337,620 claims priority to the provisional patent application entitled, "Apparatus for Dissipating Heat Generated by Equipment Mounted to a Wall," filed on Jan. 7, 2002 and assigned U.S. Application Ser. No. 60/344,805. The entire contents of the provisional patent application mentioned above is hereby incorporated by reference.

The present application is also related to U.S. non-provisional patent application entitled, "System and Method for Communicating Optical Signals between a Data Service Provider and Subscribers", filed on Jul. 5, 2001 and assigned U.S. application Ser. No. 09/899,410. The entire contents of this non-provisional patent application mentioned above is also hereby incorporated by reference.

TECHNICAL FIELD

The present invention relates to heat removal systems for electronic devices. More particularly, the present invention relates to removing heat from a subscriber optical interface housing that can be attached to structures such as homes and office buildings.

BACKGROUND OF THE INVENTION

A number of electronic systems today include electronic equipment that mounts to a wall of a home or business, or other similar surfaces. These systems can include telephone systems which have interface boxes popularly called NIDs, or network interface devices, and boxes used by cable television system suppliers. Advanced residential and business communications systems, such as those employing fiber optic cable to the homes or businesses, utilize boxes on the side of the home that may include significant active (power-consuming) circuitry.

Service providers usually mount equipment of this nature outside the house, preferably at the utility point entrance. In this way, the service provider is afforded access to the equipment without requiring the subscriber to be at home. Another reason why NIDs are mounted outside of structures is due to the number or size (or both) of conduits coupled to the NIDs. In other words, usually the number of cables connected to an enclosure of a NID makes it difficult to mount it inside a structure and to have the NID be aesthetically pleasing to the subscriber.

Related to the inclusion of power-consuming circuitry is how power can be dissipated at the NIDs. Since power is dissipated in the boxes or enclosures for the NIDs, a significant amount of heat can be generated. This heat should be moved to the air outside the enclosure efficiently in order to prevent damaging temperatures from developing in the enclosure. In some types of equipment, heat fins are used for this purpose, but they are unattractive and thus cannot be used in front of this type of equipment. Also, in some cases, the enclosure could be exposed to direct sunlight. When this happens, heat sinks on the front of the unit can be more harmful than good since the fins may become heated by the sunlight and cause the heat fins to work in reverse by injecting heat into the enclosure instead of removing it.

In some cases, enclosures can be made large enough that adequate heat removal may be provided by simply having sufficient surface area to dissipate the heat. However, the trend is toward smaller enclosures with a higher concentration or denser electronic packaging that includes several heat-producing components. These numerous heat producing components tend to exacerbate the problems with this smaller enclosure approach.

Accordingly, there is a need in the art for a heat transfer system for relatively small enclosures of subscriber interfaces that can remove heat produced by electronics positioned within the enclosure in an efficient manner. There is a further need in the art for heat removal systems of subscriber optical interfaces that can substantially reduce heat transfer from the external environment to inside the enclosure of the subscriber interface. Another need exists in the art for producing a small heat removal system that efficiently removes heat from the inside of an enclosure and meanwhile, is aesthetically pleasing to the subscriber.

SUMMARY OF THE INVENTION

The present invention is generally drawn to a system and method for removing heat from an enclosure or housing of a subscriber optical interface. The subscriber optical interface can support optical communications between a subscriber and a data service hub. The system and method of the present invention can comprise selecting a position of fins that are part of a finned array designed to remove heat from a housing or enclosure of a subscriber optical interface. The position of the fins relative to entire subscriber optical interface can be chosen such that transfer of heat from the surrounding environment into the enclosure via the fins is minimized and the transfer of heat from the fins to the environment is maximized.

According to one exemplary embodiment of the present invention, the fins can be positioned between a subscriber optical interface housing and a structure such that sunlight does not strike some or all of the fins of the finned array. The structure can comprise a building such as house. However, the structure can comprise other objects such as a utility pole, a utility cabinet, or other like structures.

When a subscriber optical interface housing is attached to a structure such that a partially enclosed volume of space remains between the structure and the subscriber optical interface housing, this partially enclosed volume of space can produce a chimney effect when heat from the subscriber optical interface housing is intended to flow from the fins into the air. This chimney effect can refer to a fluid such as air within the partially enclosed space that is heated by the fins and that rises upward when the ambient or surrounding fluid is cooler relative to the heated fluid.

The shape or position (or both) of the fins can be selected to the maximize the chimney effect mentioned above. This means that the shape of the fins can be selected to maximize heat transfer from the fins to the ambient air that is present in the enclosed volume of space between the subscriber optical interface and the structure in which the subscriber optical interface is attached. Specifically, the shape that includes a size of the fins can be selected to maximize the chimney effect. According to one exemplary embodiment, the fins can comprise a triangular cross-sectional shape.

A color of the fins of the finned array can be selected such that the color of the fins does not promote absorption of heat. According to one exemplary embodiment, a white color can be selected and applied to the top portions of the fins in order to reflect light which may strike the fins of the finned array.

In addition to shaping, sizing, positioning, and coloring the fins to maximize the chimney effect, the present invention can comprise selecting a position of heat producing elements such that this chimney effect is maximized. This means that first heat producing elements that produce more heat than second heat producing elements can be positioned below the second heat producing elements.

The present invention can also comprise blocking the transfer of heat from the environment to the fins of a finned array with a shield. More specifically, the present invention can comprise attaching a planar shield to the fins of a finned array such that the planar shield deflects any heat from the external environment radiating towards the fins. Stated differently, when fins of a finned array are positioned between a subscriber optical interface housing and a structure, the structure can radiate heat towards the fins that face the structure. In order to substantially reduce or block this heat radiating from the structure towards the fins of the finned array, a shield comprising a planar plate of metal can be attached to the fins of the finned array in order to block any heat radiating from the structure towards the fins of the finned array.

Further, a heat dissipater plate can comprise a thickened region integral with the plate that corresponds to a spacing that may exist between a heat producing element and a heat dissipater plate if the thickened region was not present. In other words, the thickened region may fill in any air gaps that could exist between a heat dissipater plate and the heat producing elements. The thickened region of this heat dissipater plate can include one or more increased magnitudes of thickness that project or protrude from the heat dissipater plate to directly contact a heat producing element on a printed circuit board such that heat is transferred from the heat producing element to the thickened region of this dissipater plate. According to one exemplary embodiment, a cross-section of the heat dissipater plate with integral thickened regions can comprise a plurality of rectangular shapes having various sizes that are dependent upon the thickness of respective heat producing elements. Also, in addition to adjusting relative heights of the thickened regions to contact the heat dissipating elements, the surface areas of the thickened regions can be sized to match the surface areas of respective heat producing elements where contact between the two structures occurs.

Instead of increasing the thickness of a heat dissipater plate to form the integral thickened regions mentioned above, the present invention can include heat transfer pucks that comprise structures separate from the heat dissipater plate that can be positioned between a heat producing element and the heat dissipater plate. In other words, heat transfer pucks can be substituted for thickened regions of the heat dissipater plates, and vice-versa.

The puck, similar to the thickened region of the heat dissipater plate discussed above, can act as a heat transfer conduit between the heat producing elements and a heat dissipater plate. When using two heat dissipater plates where a first heat dissipater plate has fins and a second heat dissipater that does not have fins, one or more pucks can be positioned between the heat transfer plates to function as heat transfer conduits between the two plates. The pucks can also be smaller than a printed circuit board and the first and second heat dissipater plates discussed above.

And in some exemplary embodiments, two or more pucks can be employed for a respective printed circuit board. Each heat transfer puck can comprise a thickness that corresponds to a spacing that may exist between a heat producing element and a heat dissipater plate if the puck was not present. In other words, the puck may fill in any air gaps that could exist between a heat dissipater plate and the heat producing elements.

In other words, similar to the thickened regions discussed above, the pucks can be sized such that one side of a puck can contact a heat producing element and another side of the puck can contact a heat dissipater plate. The shape and size of each puck can be selected to correspond to a respective heat producing element on the printed circuit board. This means that in addition to adjusting relative heights of the pucks to contact the heat dissipating elements, the surface areas of the pucks can be sized to match the surface areas of respective heat producing elements where contact between the two structures occurs.

According to one exemplary embodiment where pucks are used, a housing for the subscriber optical interface can comprise openings designed to receive the pucks such that a heat dissipater plate outside of the housing can be attached to the pucks. The openings are typically shaped to closely match the shape of the heat transfer pucks.

The present invention can comprise placing a second heat dissipater plate between a printed circuit board and a first heat dissipater plate. Through one or more heat transfer pucks or thickened regions disposed between the first and second plates, heat present in the second heat dissipater plate from the heat producing elements on the printed circuit board can be transferred from the second heat dissipater plate to the first heat dissipater plate. The second heat dissipater plate can be in closer proximity to the heat producing elements relative to the first heat dissipater plate.

The present invention can also comprise placing a heat conducting material between heat producing elements on a printed circuit board and a heat dissipater plate for transferring heat from the heat producing elements to the heat dissipater plate. The heat conducting material can act as a heat transfer conduit between the heat producing elements on the printed circuit board and the heat dissipater plate. In other words, the heat conducting material may fill in any air gaps that could exist between a heat dissipater plate and the heat producing elements. The heat conductive material can also be placed between heat transfer pucks and the heat producing elements such that any air gaps between the pucks and a heat dissipater plate are filled in.

According to another exemplary embodiment, the subscriber optical interface can be shaped to form an internal chimney structure that is entirely surrounded by a housing of the subscriber optical interface. In other words, the subscriber optical interface housing can comprise a hollow cavity that is formed by internal walls of the subscriber optical interface. Within this chimney structure, a plurality of fins can be positioned within the chimney structure to transfer heat. The fins within the chimney structure can be shaped and positioned to maximize the chimney effect of the chimney structure. According to one exemplary embodiment, the subscriber optical interface housing can comprise a parallel piped shaped structure.

To control the temperature within the chimney structure of the subscriber optical interface housing, a plurality of shutters can be positioned at one end of the chimney structure. These shutters can be moved with an actuator coupled to a temperature sensing device. According to one exemplary embodiment, the temperature sensing device and actuator can comprise a single structure such as a temperature sensitive spring. In such an embodiment, the spring can comprise bimetallic materials that react with predetermined temperatures.

BRIEF DESCRIPTION OF THE DRAWINGS

FIG. 3A is a cross-sectional view of a heat removal system according to a first exemplary embodiment of the present invention.

FIG. 3B is a view of the exemplary heat removal system with the lid removed and attached to a structure illustrated in FIG. 3A.

DETAILED DESCRIPTION OF EXEMPLARY EMBODIMENTS

Figure 1:
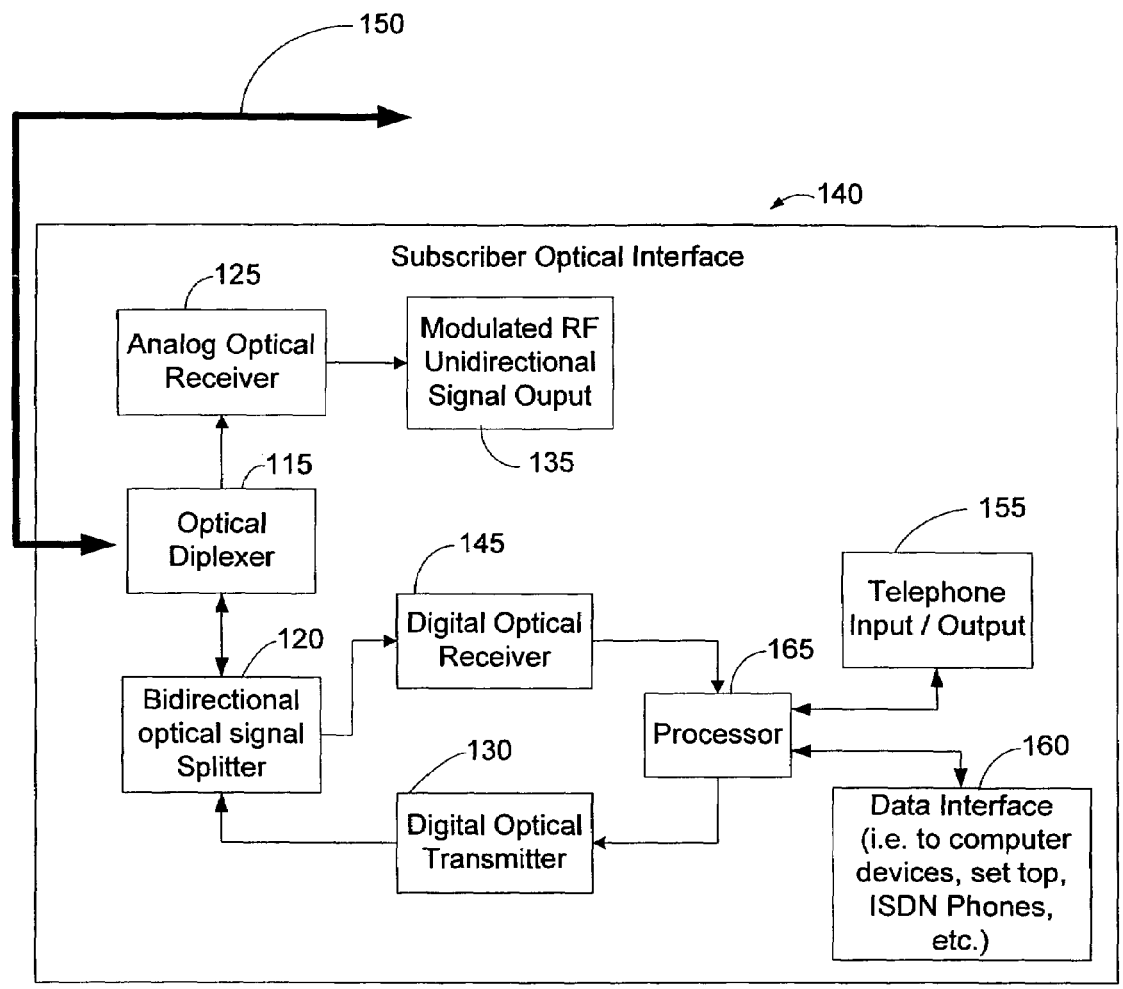
FIG. 1 is a functional block diagram illustrating some exemplary electronics that may be protected with a heat removal system according to one exemplary embodiment of the present invention.

The present invention is generally drawn to a system and method for removing heat from an enclosure or housing of a subscriber optical interface. When a subscriber optical interface housing is attached to a structure such that a partially enclosed volume of space remains between the structure and the subscriber optical interface housing, this partially enclosed volume of space can produce a chimney effect when heat from the subscriber optical interface housing is intended to flow from the fins towards the structure. This chimney effect can refer to a fluid such as air within the partially enclosed space that is heated by the fins and that rises upward when the ambient or surrounding fluid is cooler relative to the heated fluid. The shape or position (or both) of the fins can be selected to the maximize chimney effect mentioned above.

According to another exemplary embodiment, the subscriber optical interface can be shaped to form an internal chimney structure that is entirely surrounded by a housing of the subscriber optical interface. In other words, the subscriber optical interface housing can comprise a hollow cavity that is formed by internal walls of the subscriber optical interface. Within this chimney structure, a plurality of fins can be positioned within the chimney structure to transfer heat. The fins within the chimney structure can be shaped and positioned to maximize the chimney effect of the chimney structure. According to one exemplary embodiment, the subscriber optical interface housing can comprise a parallel piped shaped structure.

Referring now to the drawings, in which like numerals represent like elements throughout the several Figures, aspects of the present invention and the illustrative operating environment will be described.

Exemplary Heat Producing Components

Referring now to FIG. 1, this figure illustrates a functional block diagram of some exemplary electronics of a subscriber optical interface 140 that may be protected with an heat removal system according to one exemplary embodiment of the present invention. The subscriber optical interface 140 functions to convert downstream optical signals received from an optical tap (not illustrated) via a distribution optical waveguide 150 into the electrical domain that can be processed with appropriate communication devices.

The subscriber optical interface 140 further functions to convert upstream electrical signals into upstream optical signals that can be propagated along the distribution optical waveguide 150. The subscriber optical interface 140 can comprise an optical diplexer 115 that divides the downstream optical signals received from the distribution optical waveguide 150 between a bi-directional optical signal splitter 120 and an analog optical receiver 125. The optical diplexer 115 can receive upstream optical signals generated by a digital optical transmitter 130. The digital optical transmitter 130 converts electrical binary/digital signals to optical form so that the optical signals can be transmitted back to a data service hub (not shown) via the optical waveguide 150.

Conversely, the digital optical receiver 145 converts optical signals into electrical binary/digital signals so that the electrical signals can be handled by processor 165. The analog optical receiver 125 can convert the downstream broadcast optical video signals into modulated RF television signals that are propagated out of the modulated RF unidirectional signal output 135. The modulated RF unidirectional signal output 135 can feed RF receivers such as television sets (not shown) or radios (not shown). The analog optical receiver 125 can process analog modulated RF transmission as well as digitally modulated RF transmissions for digital TV applications.

The bi-directional optical signal splitter 120 can propagate combined optical signals in their respective directions. That is, downstream optical signals entering the bi-directional optical splitter 120 from the optical the optical diplexer 115, are propagated to the digital optical receiver 145. Upstream optical signals entering it from the digital optical transmitter 130 are sent to optical diplexer 115 and then to an optical tap (not illustrated). The bi-directional optical signal splitter 120 is connected to a digital optical receiver 145 that converts downstream data optical signals into the electrical domain. Meanwhile the bi-directional optical signal splitter 120 is also connected to a digital optical transmitter 130 that converts upstream electrical signals into the optical domain.

The digital optical receiver 145 can comprise one or more photoreceptors or photodiodes that convert optical signals into the electrical domain. The digital optical transmitter 130 can comprise one or more lasers such as the Fabry-Perot (F-P) Lasers, distributed feedback lasers, and Vertical Cavity Surface Emitting Lasers (VCSELs).

The digital optical receiver 145 and digital optical transmitter 130 are connected to a processor 165 that selects data intended for the instant subscriber optical interface 140 based upon an embedded address. The data handled by the processor 165 can comprise one or more of telephony and data services such as an Internet service. The processor 165 is connected to a telephone input/output 155 that can comprise an analog interface.

The processor 165 is also connected to a data interface 160 that can provide a link to computer devices, set top boxes, ISDN phones, and other like devices. Alternatively, the data interface 160 can comprise an interface to a Voice over Internet Protocol (VoIP) telephone or Ethernet telephone. The data interface 160 can comprise one of Ethernet's (10BaseT, 100BaseT, Gigabit) interface, HPNA interface, a universal serial bus (USB) an IEEE1394 interface, an ADSL interface, and other like interfaces.

While the aforementioned electronics support both the optical and electrical domains, the present invention is not limited to removing heat from this type of electronics. In other words, the present invention is not limited to removing heat from only subscriber optical interfaces. The present invention can also remove heat from other types of electronics and electrical devices such as electrical power transformers, telephone junctions, and other like devices.

Exemplary Heat Removal System

Figure 2:
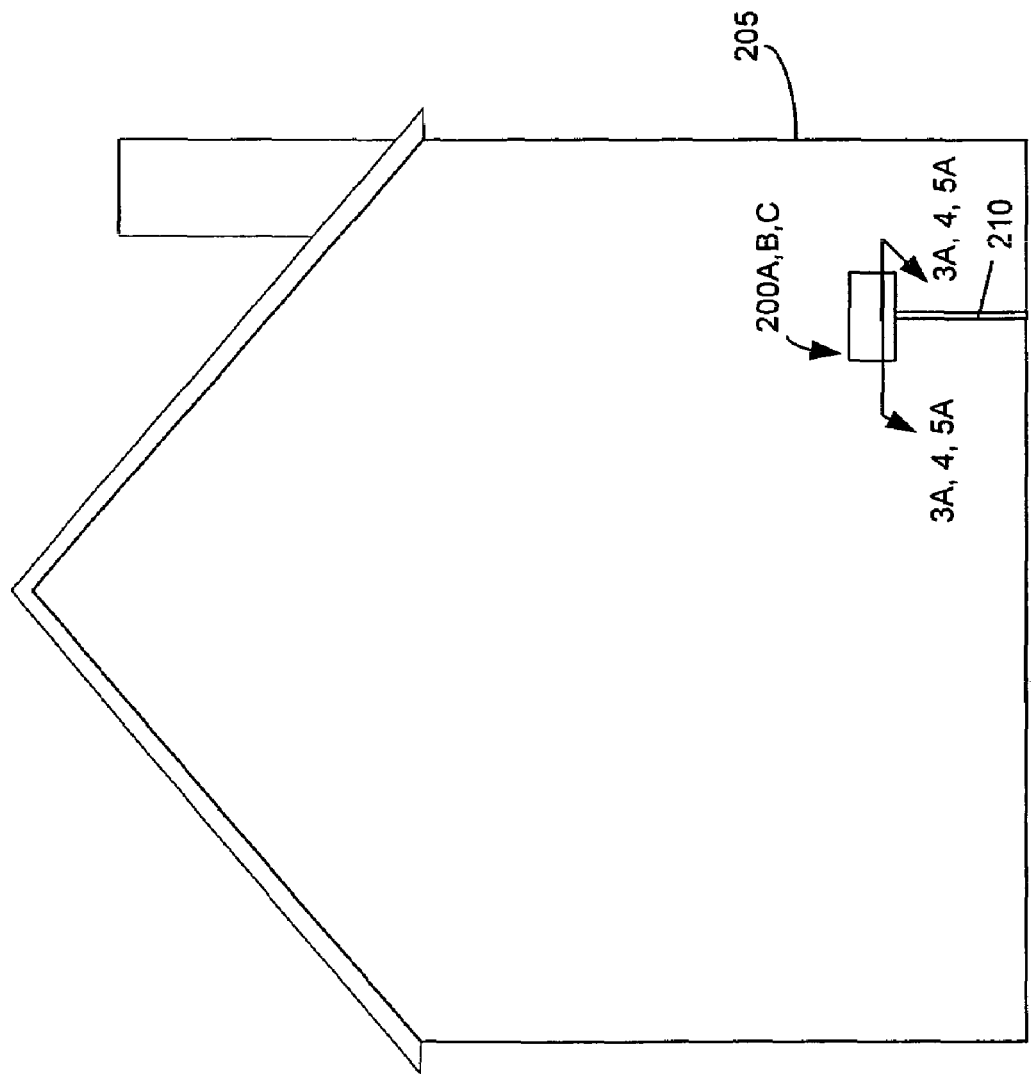
FIG. 2 illustrates a view of an exemplary heat removal system according to the first through fifth exemplary embodiments mounted to a structure such as a house.

Referring now to FIG. 2, this figure illustrates a side view of an exemplary heat removal system 200A according to the first through third exemplary embodiments mounted to a structure 205 such as a house. The heat removal system 200A is coupled to a service conduit 210 that may comprise a coaxial cable or an optical waveguide 150 such as optical fiber. While the structure 205 may comprise a house, those skilled in the art will appreciate that other structures are not beyond the scope of the present invention. Other structures can include, but are not limited to, office buildings, apartment buildings, utility poles, utility cabinets, utility buildings, and other like structures.

Referring now to FIG. 3A, this figure illustrates a top cross-sectional view of a heat removal system 200A according to a first exemplary embodiment of the present invention. The heat removal system 200A can comprise a housing or enclosure 305, a first heat dissipater plate 310, fins 315, and heat conducting material 320.

The enclosure 305 can comprise a two-piece housing in which the first piece 325 is attached to the structure 205 that can comprise a wall of a house. Those skilled in the art will appreciate that the structure 205 can be made from any materials without departing from the scope and spirit of the present invention. Materials for the structure 205 include, but are not limited to, metal, brick, concrete, wood, synthetic resins or composite materials, and other like materials.

The second piece 330 of the enclosure 305 can comprise a moveable lid. The second piece 330 can rotate around a hinge 335 and can be fastened to the first piece 325 with a latching mechanism 340. However, those skilled in the art will appreciate that the second piece 330 could be secured to the first piece 325 without a hinge 335 or latching mechanism 340. The second piece 330 could have a slideable fit with the first piece 325 or both pieces forming the enclosure 305 could be secured together with fasteners or an adhesive.

When the second piece 330 of the enclosure 305 is open relative to the first piece 325, the first piece 325 may be mounted to the structure 205 with fasteners 345. The fasteners 345 may comprise screws, but other types of fasteners are not beyond the scope of the present invention. Other fasteners can include, but are not limited to, rivets, plastic snap-in fasteners, bolts, nails, adhesives, welds, and other like fasteners.

The enclosure 305 may further comprise standoffs 350 to space the enclosure 305 from the structure 205 and to form a channel or semi-enclosed volume 357. Typically the enclosure 305 can be made from plastic materials, but other materials may be used. Other materials include, but are not limited to, metals (such as ferrous alloys and non-ferrous alloys), ceramics, polymers, and composite materials.

In the exemplary embodiment illustrated in FIG. 3A, a rear portion of the enclosure 305 can be removed or is never made. The heat dissipater plate 310 can complete the rear of the enclosure 305. The heat dissipater plate 310 can comprise a flat piece of metal such as aluminum to which fins 315 are attached. However, other metals which can conduct heat are not beyond the scope of the present invention. Other metals can include, but are not limited to, ferrous alloys (such as iron and steel), and non-ferrous alloys (such as magnesium, beryllium, copper, nickel, cobalt, zinc, and titanium).

While the cross-sectional view of the heat dissipater plate 310 in FIG. 3A depicts the printed circuit board 355 to have a thickness greater than the heat dissipater plate 310, those skilled in the art will appreciate that these elements illustrated in these drawings are not to scale and are for illustrative purposes only. It is possible in some exemplary embodiments that the heat dissipater plate 310 could have a thickness equal to or greater than the printed circuit board 355. This also applies to the enclosure 305 which is depicted with a thickness equal to the dissipater plate 310. The enclosure 305 in some exemplary embodiments could have a thickness that is greater than the heat dissipater plate 310 or greater than or equal to the printed circuit board 355. This discussion of scaling and relative sizes of elements applies to all elements and all figures corresponding to this detailed description.

The fins 315 can comprise the same material as the heat dissipater plate 310 or the fins 315 can comprise different metals relative to the heat dissipater plate 310. The heat dissipater plate 310 can be fastened to the enclosure 305 with an adhesive material (not illustrated) in order to form a weather tight seal. However, the heat dissipater plate could be attached to the enclosure 305 with fasteners such as screws, rivets, welds, or other like fasteners. If attached with fasteners, a gasket or seal (not illustrated) could be positioned between a circumferential edge of the heat dissipater plate 310 and an edge of the enclosure 305 to form the weather tight seal. The weather tight seal can be designed to keep any moisture from entering the enclosure 305 via the heat dissipater plate 310/enclosure 305 junction.

Attached to the heat dissipater plate 310 is a printed circuit board (PCB) 355. The PCB 355 can be attached to the heat dissipater plate 310 by fasteners 345 that can comprise screws, adhesives, welds, or other like fasteners. The PCB may be spaced apart from the heat dissipater plate 310 by spacers 360. The spacers 360 may or may not be an integral part of the fasteners 345.

The PCB 355 can further comprise heat producing elements 365A, 365B, 365C. These heat producing elements can comprise anyone of the electronic elements that form the subscriber optical interface 140 discussed above with respect to FIG. 1. Specifically, the heat producing elements 365A, 365B, 365C can comprise an analog optical receiver, a digital optical transmitter, a digital optical receiver, a processor, a data interface, a telephone input/output, and an a unidirectional signal output. However, as discussed above, the present invention is not limited to removing heat for elements forming subscriber optical interfaces. Other devices that can produce heat in which the present invention could be used include, but are not limited to, electric power transformers, telephone drops, coaxial cable TV junctions, and other like devices.

The heat producing elements 365 supported by the PCB 355 can be coupled to the heat dissipater plate 310 with a heat conducting material 320. The heat conducting material 320 can comprise a flexible and somewhat compressible material such that it fills-in a predetermined space, making good thermal contact with both the heat producing elements 365 and the heat dissipater plate 310. The heat conducting material 320 can comprise a high thermal conductivity silicone elastomer such as THERM-A-GAP G974 or G574 that is manufactured by Chomerics of Massachusetts. The heat conducting material 320 can comprise composite materials that include aluminum and boron nitride particles. However, other heat conductive materials 320 are not beyond the scope and spirit of the present invention.

The heat conducting material 320 functions as a heat transfer conduit between the heat producing elements 365 on the printed circuit board 355 and the heat dissipater plate 310. The heat conducting material 320 can have a thickness that corresponds to a spacing that may exist between a heat producing element 365 and the heat dissipater plate 310 if the heat conducting material 320 was not present. In other words, the heat conducting material 320 may fill in any air gaps that could exist between a heat dissipater plate 310 and the heat producing elements 365.

The heat conducting material 320 is designed to directly contact both a heat producing element 365 and a heat dissipater plate 310 such that heat moves from the heat producing element 365, through the heat conducting material 320, and to the heat dissipater plate 310. The heat conducting material 320 can be applied to heat producing elements 365 on the printed circuit board 355 prior to attaching the printed circuit board 355 to the heat dissipater plate 310.

While using the heat conducting material 320 to couple the heat producing elements 365 to the heat dissipater plate 310 is part of a preferred exemplary embodiment, it is possible to mount the PCB 355 on the heat dissipater plate 310 in order to place the heat producing elements 365 directly against the heat dissipater plate 310 without using the heat conducting material 320. For example, the third heat producing element 365C illustrated in FIG. 3A can be mounted directly against the heat dissipater plate 310 without any heat conducting material 320.

However, according to another preferred yet exemplary embodiment, even when heat producing elements 365 can be mounted directly against the heat dissipater plate 310, the heat conducting material 320 can be applied to the heat producing elements 365 in order to substantially improve heat transfer from the heat producing elements 365 to the heat dissipater plate 310. In such an embodiment, the heat conducting material 320 would have a substantially reduced thickness to form a very thin and compressible layer.

The cross-sections of two of the heat producing elements 365A and 365B have been shaded with thin and thick lines to indicate that these structures can comprise resin or plastic. Meanwhile, the cross-section of the third heat producing element 365C has been shaded with uniform thin lines to indicate that this structure can comprise metal. However, those skilled in the art will appreciate that the present invention is not limited to heat producing elements 365 that only comprise plastic or metal materials. Other materials that may form the heat producing elements 365 include, but are not limited to, mixtures or composites, ceramics, polymers, and other like materials.

Similarly, the cross-section of the heat conducting material 320 illustrated in FIG. 3A has been shaded with thin and thick lines to indicate that the material 320 can comprise plastic or resin. However, as noted above, the heat conducting material 320 can comprise metallic particles such as aluminum or boron. And the heat conducting material 320 is not limited to these materials. Other heat conducting materials can include, but are not limited, to, wire meshes, foam materials, and enclosed fluidic heat transfer materials sometimes referred to as "heat pipes" in the industry.

As illustrated in FIG. 3A, the fins 315 can be positioned between a subscriber optical interface housing 305 and a structure 205 such that sunlight does not strike a majority or any of the fins 315 of the finned array. This positioning of the fins 315 between the housing or enclosure 305 and structure 205 can substantially reduce heat transfer from the environment outside of the enclosure 305 into the enclosure 305. Specifically, positioning the fins in this manner can substantially reduce or eliminate the fins 315 from becoming heated by sunlight. As mentioned previously, when fins 315 are heated by sunlight, the fins 315 may work in reverse by injecting heat into the enclosure 305 instead of removing it.

When the subscriber optical interface housing 305 is attached to the structure 205 such that an enclosed volume of space 357 remains between the structure 205 and the subscriber optical interface housing 305, this enclosed volume of space 357 can produce a chimney effect when heat from the subscriber optical interface housing 305 is intended to flow from the fins 315 towards the structure 205. Because of their proximity to the structure 205, the fins 315 can form vertical columns 357(1), 357(2), 357(N) of space that promote this chimney effect. This chimney effect can refer to a fluid such as air heated by the fins 315 rising upward through the vertical columns 357(1), 357(2), 357(N) when the ambient or surrounding fluid is cooler relative to the heated fluid. The chimney effect results in additional convection cooling across the fins 315.

As illustrated in FIG. 3A, when the housing 305 is connected to the structure 205, the fins 315 may come in close proximity to but do not contact the structure 145. There are at least two reasons for not letting the fins 315 touch the structure 205. First, due to normal manufacturing tolerances, it is desirable that the fins 315 be designed such that they never touch the structure 205 before the standoffs 350 touch the structure 205, as a violation of this would result in unstable mounting. Second, it is possible that the structure 205 itself could be hot, being heated by direct sunlight, and it is not desirable that this heat be transferred to the fins 315.

The fins 315 may be made using extrusion processes well known to those skilled in the art. The heat dissipater plate 310 and fins 315 can be made as one piece, though they are described as separate pieces in this description for easy understanding of the concepts of the present invention.

The shape or position (or both) of the fins 315 can be selected to the maximize chimney effect mentioned above. This means that the shape of the fins 315 can be selected to maximize heat transfer from the fins 315 to the ambient air that is present in the enclosed volume of space 357 between the subscriber optical interface enclosure 305 and the structure 205 in which the subscriber optical interface is attached. Specifically, the shape that includes a size of the fins 315 can be selected to maximize the chimney effect.

According to one exemplary embodiment, the fins 315 can comprise a triangular cross-sectional shape. This triangular cross-sectional shape can include lengths that correspond with a length of the enclosure 305. However, those skilled in the art will recognize that other shapes and sizes of the fins are not beyond the scope of the present invention. Other shapes can include, but are not limited to, rectangular, square, circular, oval, and other similar shapes. Since the fins 315 can have other shapes and sizes, these structures can be generally referred to as projections extending from a surface such as the heat dissipater plate 310.

A color of the top portions 317 of the fins 315 of the finned array may be selected such that the color of the top portions 317 does not promote absorption of heat. According to one exemplary embodiment, a white color can be selected and applied to the top portions 317 of the fins 315 in order to reflect light which may strike the top portions 317 of the fins 315. Meanwhile, the lower portions of the fins 319 may be coated with a thermal paint or other treatment that enhances radiation of heat such as black paint. However, the present invention is not limited to these colors and the combination of two colors. The fins 315 could be colored a single color. Further, other reflective colors and combinations of colors are not beyond the scope and spirit of the present invention.

Referring now to FIG. 3B, this figure is a view of the exemplary heat removal system 200A attached to a structure 205 illustrated in FIG. 3A. In this view the second piece 330 comprising the moveable lid is removed and not illustrated. Dashed lined arrows 370 denote fluid currents that produce the chimney effect discussed above where higher temperature fluid moves upward relative to lower temperature fluid because the higher temperature fluid is less dense than the lower temperature fluid and because gravity has a stronger attraction to the more dense fluid. In one exemplary embodiment, the fluid can comprise outside air.

In addition to shaping, sizing, positioning, and coloring the fins 315 to maximize the chimney effect, the present invention can comprise selecting a position of heat producing electronics 365 such that this chimney effect is maximized. This means that first heat producing elements 365(1) disposed on a first PCB 355A that produce less heat than second heat producing elements 365(2) of a second PCB 355B can be positioned above the second heat producing elements 365(2). In this way, fluid flow tends to be increased by having the greatest heat differential between the top and bottom of the partially enclosed space.

Figure 4:
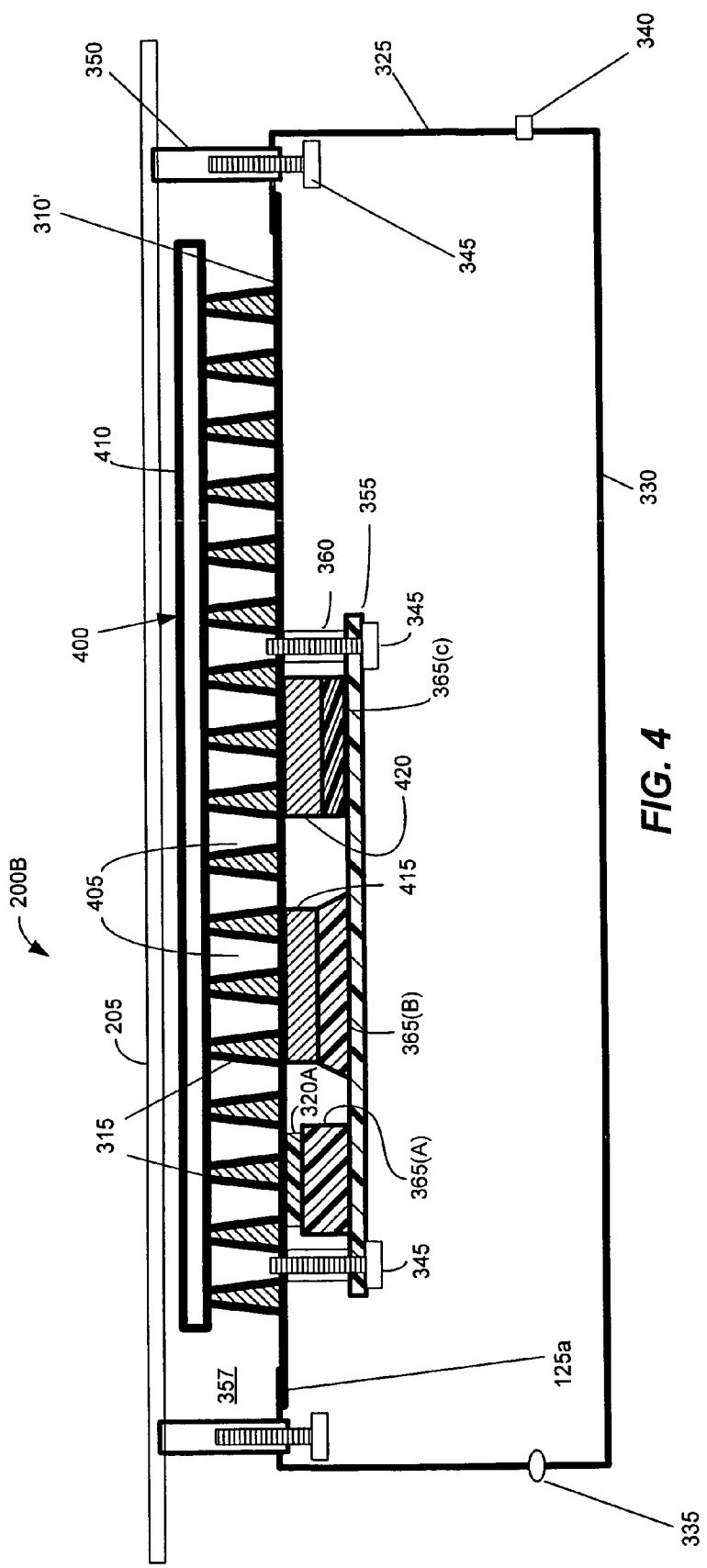
FIG. 4 is a cross-sectional view of an heat removal system with a heat shield according to a second exemplary embodiment of the present invention.

Referring now to FIG. 4, this figure illustrates a cross-sectional view of a heat removal system 200B with a heat shield 400 according to a second exemplary embodiment of the present invention. The heat removal system 200B of FIG. 4 has several components similar to those of the heat removal system 200A illustrated in FIG. 3A. Therefore, only the differences between FIGS. 3A and 4 will be discussed below with respect to FIG. 4.

The heat shield 400 may isolate the fins 315 from any heat that may be radiating from the structure 205 towards the fins 315. For example, it may be that the structure 205 may be exposed to direct sunlight and the structure 205 could be made of a material such as dark colored concrete that can absorb a significant amount of heat from sunlight or other light sources. In such a scenario, isolating the fins 315 from the structure 205 is desirable so that the structure 205 does not radiate heat into the fins 315 which could cause the fins 315 to operate in reverse as mentioned above.

The heat dissipater plate 310' can comprise a thickened region 415 that corresponds to a spacing that may exist between the heat producing element 365B and the heat dissipater plate 310' if the thickened region was not present. In other words, the thickened region may fill in any air gaps that could exist between the heat dissipater plate 310 and the heat producing elements 365. The thickened region 415 can comprise a magnitude such that heat transfer through solid structures such as this thickened region 415 of this dissipater plate 310' is maximized. Those skilled in the art recognize that more than one thickened region 415 having various shapes and sizes may be employed without departing from the scope and spirit of the present invention. The thickened region 415 can be integral with the heat dissipater plate 310' and can be formed by casting or milling type processes.

Instead of or in addition to forming thickened regions 415 on the heat dissipater plate 310', the present invention can also comprise placing a heat transfer puck 420 that is separate from the heat dissipater plate 310' between a heat producing element 365C and the heat dissipater plate 310'. That is, pucks 420 can be substituted for thickened regions 415 of the heat dissipater plates 310, and vice-versa. Each puck 420 is similar to the thickened region 415 and can act as a heat transfer conduit between the heat producing element 365 and the heat dissipater plate 310'. In other words, the puck 420 may fill in any air gaps that could exist between a heat dissipater plate 310 and the heat producing elements 365. The puck can comprise metal materials but other heat conductive materials are not beyond the scope of the present invention. The puck 420 can also be smaller in width and length than the printed circuit board 355 and the heat dissipater plate 310'.

And in some exemplary embodiments, two or more pucks 420 can be employed for a respective printed circuit board 355. Each heat transfer puck 420 can comprise a thickness that corresponds to a spacing that may exist between a heat producing element 365 and heat dissipater plate 310 if the heat transfer puck 420 was not present. In other words, the thickness of a puck 420 can comprise a magnitude where one side of the puck 420 contacts the heat dissipater plate and another side contacts the heat producing element 365 such that heat transfer through solid structures such as the puck 420 are maximized. The shape and size of each puck 420 can be selected to correspond to a respective heat producing element 365 on the printed circuit board 355. In any event, a thin sheet of a heat transfer material or compound is normally used between the heat producing element and the puck or thickened region, to promote heat transfer. This is well understood by those skilled in the art.

Meanwhile, the heat shield 400 can be an integral part of the extrusion process when forming the fins 315 and heat dissipater plate 310. The cross-section of the heat shield 400 is shaded as a hollow rectangle since it can be formed by an extrusion process where it comprises a hollow, internal cavity. The heat shield 400 can be attached to the fins 315 by any one of various fastening mechanisms such as welds. Other fastening mechanisms include, but are not limited to, adhesives, screw fasteners, and other like fastening mechanisms. It is also possible to build the heat shield 400 as a single flat and solid metallic plate integral to the fins 315. The exterior of the heat shield 400 can enclose a volume 405 of space between the heat shield 400 and heat dissipater plate 310.

According to one exemplary embodiment, it is desirable for a side 410 of the heat shield 400 that faces the structure 205 to be heat reflective. This may be accomplished by either leaving it a shiny metallic surface or possibly painting the surface a heat reflective color such as white. Other ways for treating a surface to reduce the tendency to pick up (or radiate) heat are well known to those skilled in the art and are not beyond the scope of the present invention.

Figure 5A:
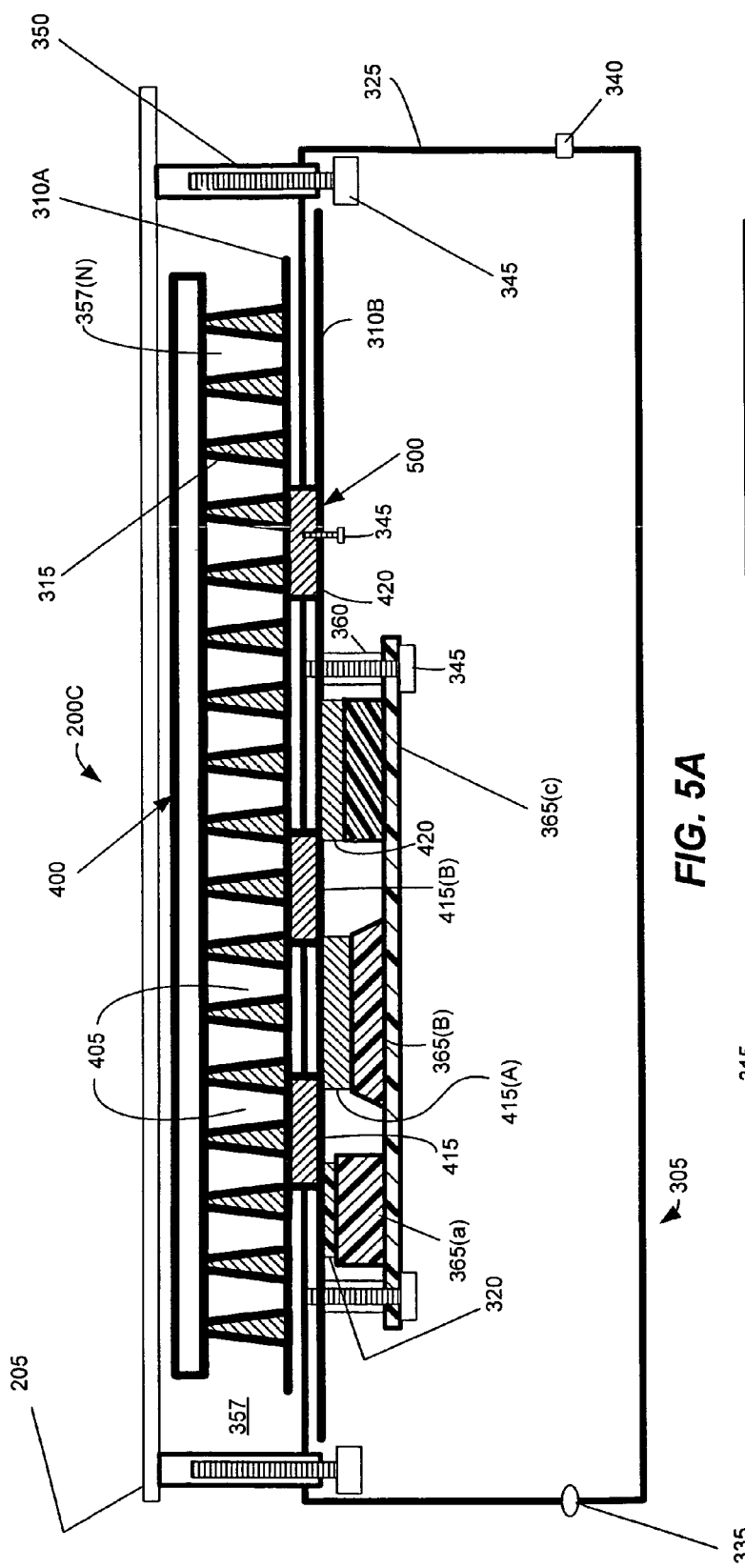
FIG. 5A is a cross-sectional view of an heat removal system with heat transfer pucks and a second heat dissipater plate according to a third exemplary embodiment of the present invention.

Referring now to FIG. 5A, this figure illustrates a top cross-sectional view of an heat removal system 200C comprising heat transfer pucks 420, thickened regions 415, and first and second heat dissipater plates 310A, 310B according to a third exemplary embodiment of the present invention. The heat removal system 200C of FIG. 5A has several components similar to those of the heat removal system 200B illustrated in FIG. 4. Therefore, only the differences between FIGS. 5A and 4 will be discussed below with respect to FIG. 5A.

A second heat dissipater plate 310B is positioned within the enclosure 305 while a first heat dissipater plate 310A that comprises the fins 315 remains outside of the enclosure 305. The second heat dissipater plate 310B can comprise a first thickened region 415A that is integral with the second heat dissipater plate 310B. The first thickened region 415A can be designed to contact a second heat producing element 365B that is disposed on the printed circuit board 355.

The second thickened region 415B can be integral with the first heat dissipater plate 310A and can be positioned against a side of the second heat dissipater plate 310B that is opposite to the first thickness 415A. According to alternate exemplary embodiment (not shown), the second heat dissipater plate 310B could comprise both the first and second thickened regions 415A, 415B that are integral with the second heat dissipater plate 310B.

The second thickened region 415B can contact the second heat dissipater plate 310B. The second thickened region 415B can function as a heat transfer conduit between the first and second heat dissipater plates 310A, 310B. Instead of or in addition to the first and second thickened regions 415A and 415B, pucks 420 that are separate from the heat dissipater plates 310A, 310B can be employed between the second heat dissipater plate 310B and the PCB 355 and between the first and second heat dissipater plates 310A, 310B. Those skilled in the art recognize that various combinations of thickened regions 415 and pucks 420 can be employed in each of the embodiments discussed in this detailed description with out departing from the scope and spirit of the present invention.

The pucks 420 or thickened regions 415 (or both) between the heat dissipater plates 310A, 310B can also serve as a way to fasten the second heat dissipater plate 310B and its printed circuit board 355 to the first heat dissipater plate 310A as will be discussed in further below with respect to FIG. 5B.

The enclosure 305' in this exemplary embodiment is different relative to the other exemplary embodiments in that this enclosure does not have one large opening in which the first heat dissipater plate 310A covers. Rather, in this exemplary embodiment, the enclosure 305' has several shaped openings 500 (see also FIG. 5C) in the second piece 325 of the enclosure 305' that correspond with the shape of each puck 420 or thickened regions 415 (or both) that are positioned between the first heat dissipater plate 310A and second heat dissipater plate 310B. In this way, the first heat dissipater plate 310A can have an increased contact area with the second piece 325 of the enclosure 305' in order to make a weather tight seal between the second piece 325 and first heat dissipater plate 310A.

Figure 5B:
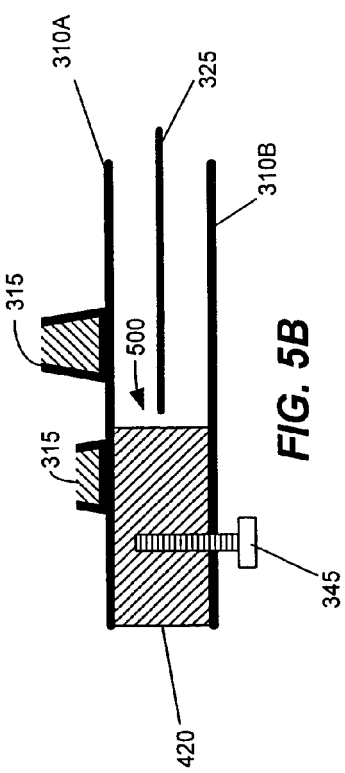
FIG. 5B illustrates a cross-sectional view of some heat fins, a heat transfer puck or thickened region, and two heat dissipater plates illustrated in FIG. 5A according to the third exemplary embodiment of the present invention.

Referring now to FIG. 5B, this figure illustrates a close-up cross-sectional view of some heat fins 315, a heat transfer puck 420 or thickened region 415, and the two heat dissipater plates 310A, 310B illustrated in FIG. 5A according to the third exemplary embodiment of the present invention. In this exemplary embodiment, a thickened region 415 integral with the first heat dissipater plate 310A can receive a fastener 345 that attaches the second heat dissipater plate 310B to the thickened region 415.

Alternatively, instead of a thickened region 415, a puck 420 (not illustrated in FIG. 5B) could be employed and it could be coupled to the first heat dissipater plate 310A with an adhesive (not illustrated). The puck 420 could also be coupled to the first heat dissipater plate 310A with other types of fasteners such as rivets, screws, welds, and other like fasteners. The puck 420 (not illustrated) could also receive the fastener 345. The fasteners 345 received by either the puck 420 or thickened region 415 can comprise screws, bolts, welds, and other like fastening elements. Either the puck 420 (not illustrated) or the thickened region 415 is positioned within an opening 500 of the second piece 325 of the enclosure 305.

While FIG. 5B depicts a spacing to exist between the first heat dissipater plate 310A and the second piece 325 of the enclosure 305 and a spacing between the second piece 325 and the second heat dissipater plate 310B, in a preferred exemplary embodiment, such spacings do not exist. In other words, the heat dissipater plate 310A and the second piece 325 contact one another. Similarly, the second piece 325 and the second heat dissipater plate 310B also contact one another. This means that the thickened region 415 (or puck 420) is sized to have thickness that permits contact of these respective structures. This contacting between structures would allow for an a good weather tight seal that should prevent moisture ingress into the enclosure 305.

Figure 5C:
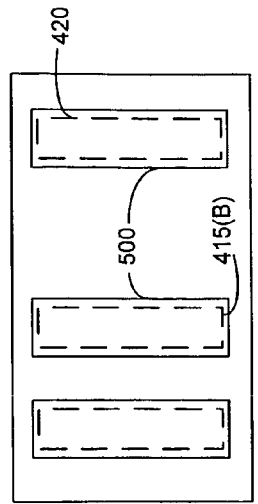
FIG. 5C illustrates openings for receiving thickened regions or pucks according to the third exemplary embodiment of the present invention.

Referring now to FIG. 5C, this figure is a bottom view of the enclosure 305 illustrating openings 500 for receiving thickened regions 415 or pucks 420 according to the third exemplary embodiment of the present invention. The thickened regions 415 and pucks 420 are illustrated with dashed lines to indicated that there is a tight fit of the openings 500 around each respective puck 420 or thickened regions 415. This tight fit permits the formation of a weather tight seal around the pucks 420 and thickened regions 415. The pucks 420 or thickened regions 415 could support a gasket or seal (not illustrated) to improve the contacting between the openings 500 and the pucks 420 and thickened regions 415.

Figures 6A, 6B:
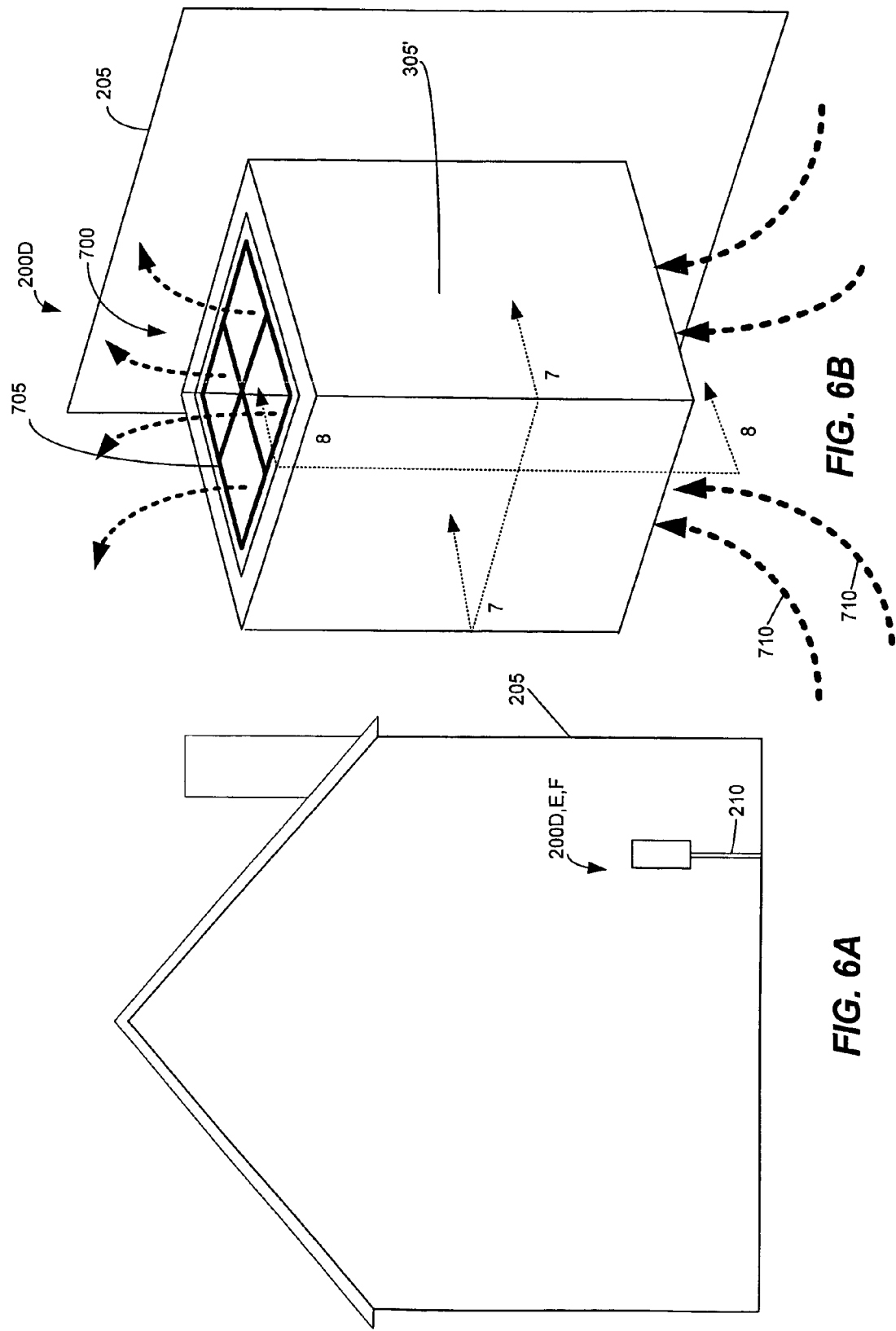
FIG. 6A is a side view of the exemplary heat removal system mounted to a structure such as a house according to a fourth, fifth, and sixth exemplary embodiment of the present invention.
FIG. 6B is an isometric view of an exemplary heat removal system according to the fourth exemplary embodiment of the present invention.

Referring now to FIG. 6A, this figure illustrates a side view of an exemplary heat removal system 200E according to a fourth exemplary embodiment mounted to a structure 205 such as a house. The heat removal system 200D is coupled to a service conduit 210 that may comprise a metal cable or an optical waveguide 150 such as an optical fiber.

Referring now to FIG. 6B, this figure illustrates an isometric view of the exemplary heat removal system 200D depicted in FIG. 6A. The heat removal system 200D according this exemplary embodiment comprises an internal chimney structure 700 that is formed when the subscriber optical interface enclosure 305' is shaped to include a hollow portion within a central region of the enclosure 305'. In other words, the subscriber optical interface housing 305' can comprise a hollow cavity or internal chimney structure 700 that is formed by internal walls of the subscriber optical interface housing 305'.

Within this chimney structure 700, a heat dissipater column 705 can be positioned. The heat dissipater column 705 can comprise a plurality of heat dissipater plates 310. Further details of the heat dissipater column 705 will be discussed below with respect to FIG. 7. Also illustrated in FIG. 6B are dashed arrows 710 that are intended to represent fluid currents that produce the chimney effect discussed above. This chimney effect yields additional convection cooling for the heat dissipater column 705.

Figure 7:
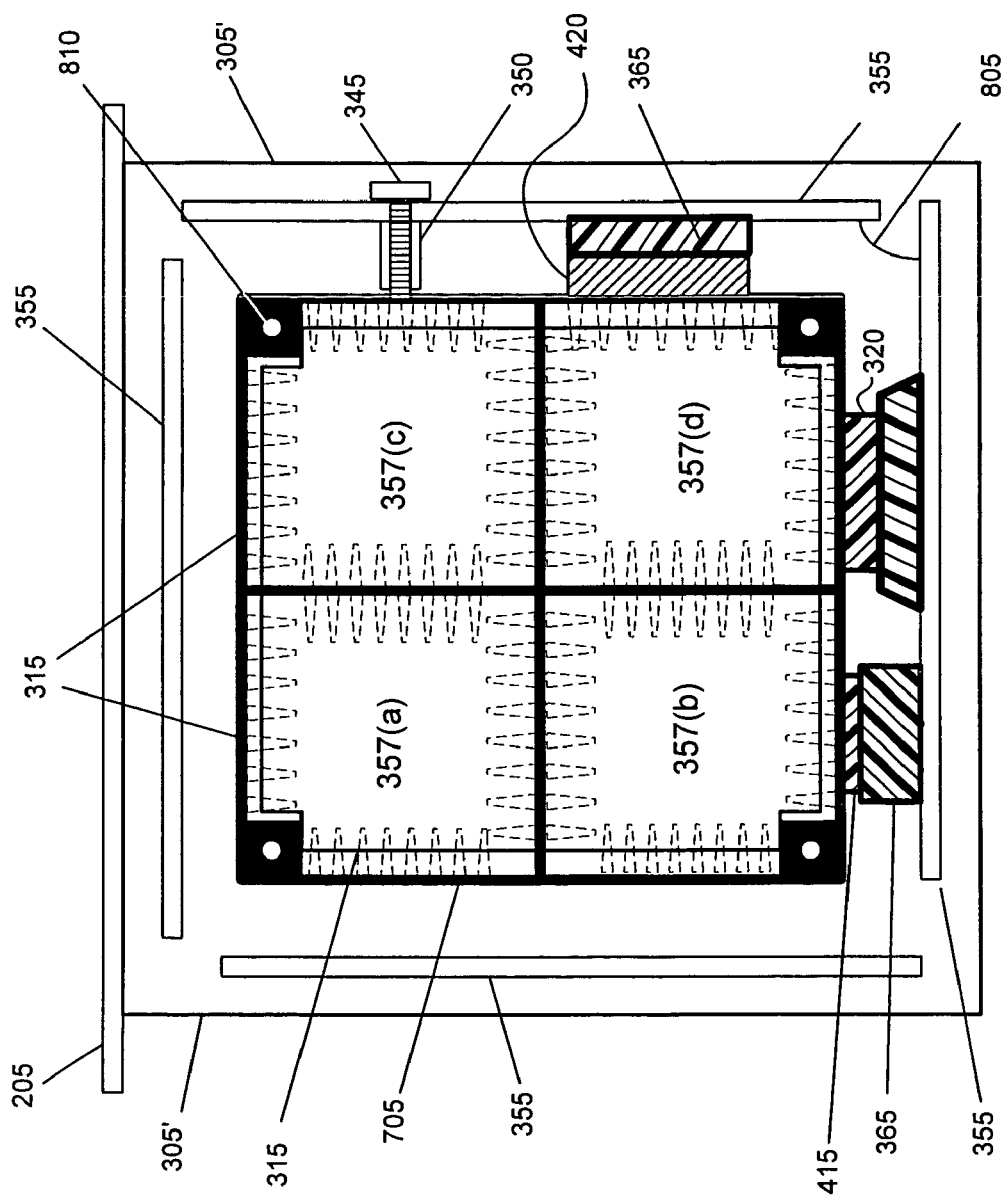
FIG. 7 is a cross-sectional view of the exemplary heat removal system illustrated in FIG. 6B taken along the cut line 7-7.

Referring now to FIG. 7, this figure illustrates a cross-sectional view of the exemplary heat removal system 200D illustrated in FIG. 6B taken along the cut line 7-7. The heat removal system 200D of FIG. 7 has several components similar to those of the heat removal systems illustrated in FIGS. 3-5. Therefore, only the differences between FIGS. 3-5 will be discussed below with respect to FIG. 7.

The heat dissipater column 705 may comprise a plurality of heat dissipater plates 310(1), 310(2), 310(3), 310(4), 310(5), and 310(6) (See FIG. 9, discussed more fully below). The fifth and sixth heat dissipater plates 310(5) and 310(6) can intersect one another in a geometric center of the column 705 to form four separate partially enclosed volumes or channels 357(a), 357(b), 357(c), and 357(d). Each enclosed volume 357 may be considered a separate chimney relative to the chimney effect discussed above. Each of the heat dissipater plates 310 can comprise fins 315 that project into a respective enclosed volume 357.

The fins 315 are illustrated with dashed lines to indicate that they are optional features for this particular exemplary embodiment. The fins 315 within the chimney structure 700 can be shaped, colored, and positioned to maximize the chimney effect. Similarly, the heat producing elements 365 of the PCBs 355 can be positioned to maximize the chimney effect as well, similar to the previous embodiments discussed above.

The heat dissipater column 705 can have a rectangular or parallel piped shape. However, other shapes are not beyond the scope and spirit of the present invention. Other shapes include, but are not limited to, pentagonal, hexagonal, octagonal, elliptical, and circular, just to name a few. The heat dissipater column 705 can further comprise second heat dissipater plates 310B (not illustrated) similar to those illustrated and discussed with respect to FIGS. 5-6 discussed above.

The individual PCBs 355 can be coupled to each other with board connecting mechanisms 805 such as wires. Other connecting mechanisms can include, but are not limited to, pins and sockets, and other like connecting mechanisms that are well known to those skilled in the art. The PCBs 355 may be made formed as one board that is designed to snap apart to form the four PCBs 355 illustrated in FIG. 8.

Figures 8, 9:
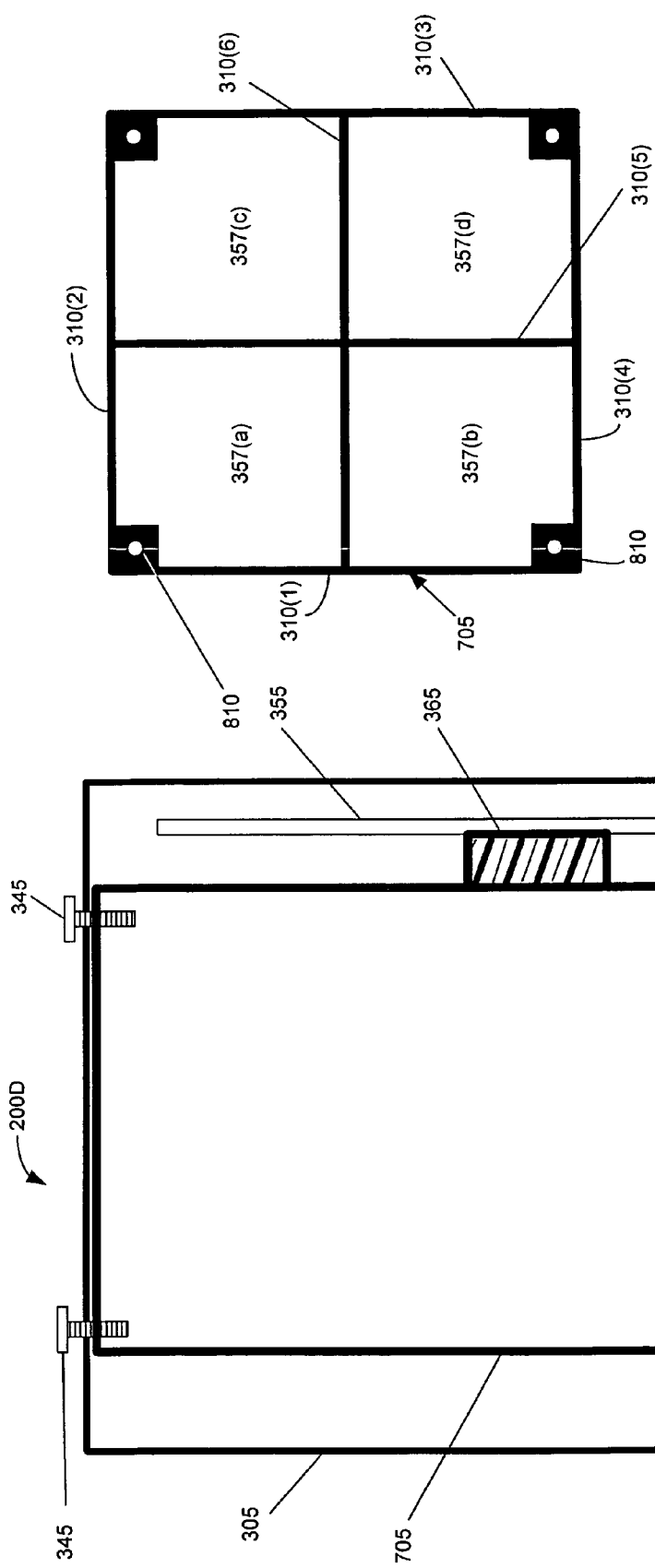
FIG. 8 is a cross-sectional view of the exemplary heat removal system illustrated in FIG. 6B taken along the cut line 8-8.
FIG. 9 is a cross-sectional view of the internal chimney structure formed by the heat removal system according to the fourth exemplary embodiment of the present invention.

Referring now to FIG. 8, this figure illustrates a cross-sectional view of the exemplary heat removal system 200D illustrated in FIG. 6B taken along the cut line 8-8. The heat dissipater column 705 extends down the length of the housing 305. The PCBs 355 are connected to the heat dissipater column 705 as described above. The housing 305 which may not have a molded bottom portion can be inserted over the heat dissipater column 705. And the housing or enclosure 305 and the heat dissipater column 705 can be connected with fasteners 345 at the top. After the housing or enclosure 305 is connected to the heat dissipater column 705, a bottom cover 900 can be fastened in place with fasteners 345. The bottom may comprise an opening (not illustrated) that corresponds with the shape of the column 705.

The housing 305 when made from plastic material can be molded such that it does not cover the heat dissipater column 705 except for the four corners of the heat dissipater column 705 where the two are fastened together at 810. The housing or enclosure 305 may also include a little overlapping portion along the edges of the column 705 for sealing the enclosure 305 against the column 705.

A typical output connector 905 can be coupled to one of the PCBs 355. If desired, housing or enclosure 305 may be extended further down (not illustrated) to form a compartment that the subscriber can access.

Referring now to FIG. 9, this figure illustrates a cross-sectional view of the internal chimney structure formed by the heat dissipater column 705 of the heat removal system 200D according to the fourth exemplary embodiment of the present invention. The heat dissipater column 705 may be conveniently fabricated as an extrusion. The heat dissipater column 705 may comprise four outer side heat dissipater plates 310(1), 310(2), 310(3), and 310(4) that can form a square or rectangle. The heat dissipater column 705 may further comprise one or more internal 0 degree cross heat dissipater plates 310(5) and 90 degree cross heat dissipater plates 310(6).

The heat dissipater column 705 can be thickened in the four corners 810 to allow mounting of the enclosure 305 as discussed above and illustrated in FIG. 7. The shape of the heat dissipater column 705 provides for one or more chimneys 357A, 357B, 357C, 357D to be formed in the center of the heat removal system 200D. Such chimneys promote convection cooling as is understood by those skilled in the art.

Figure 10:
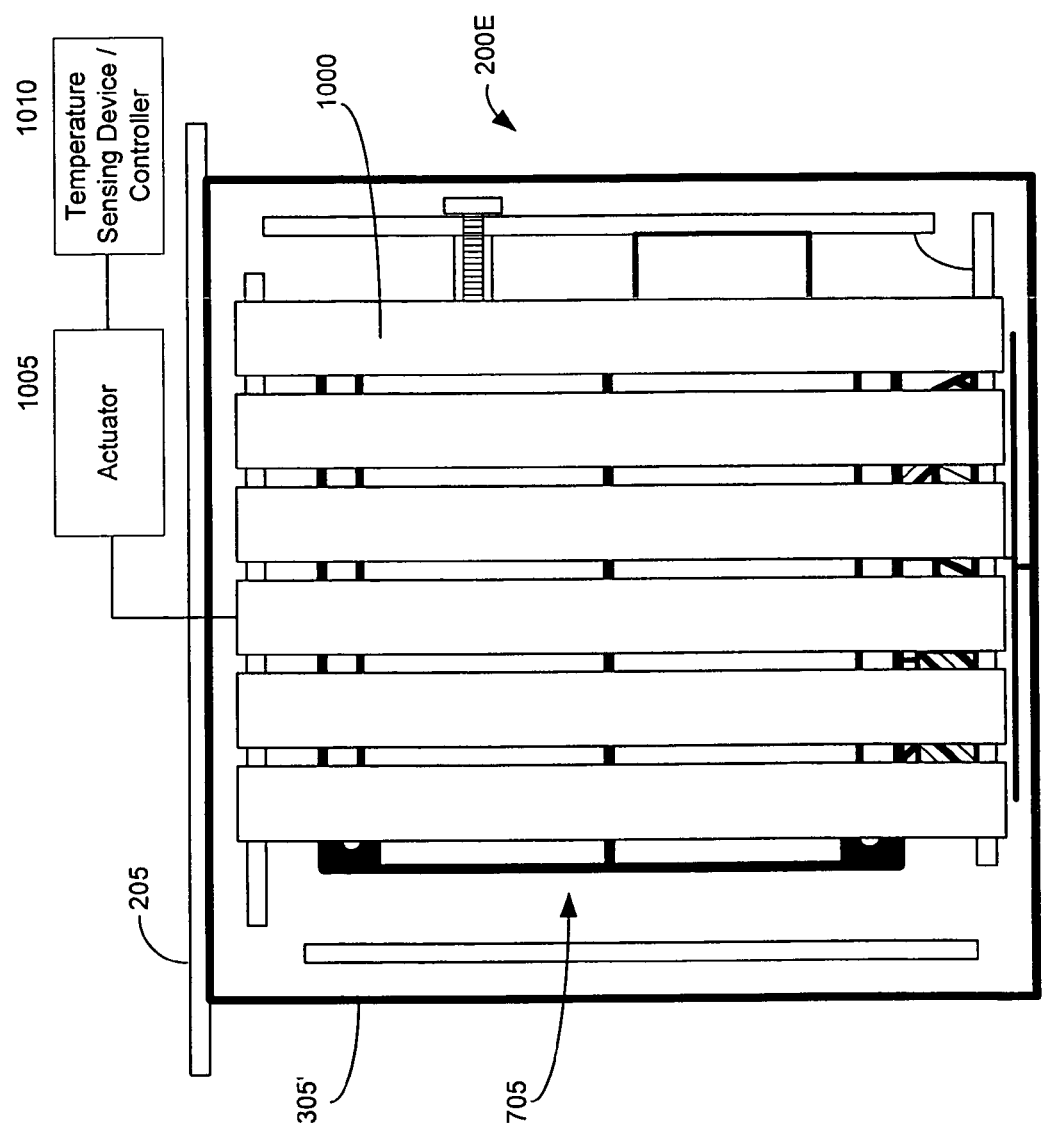
FIG. 10 illustrates an exemplary heat removal system with shutters controlled by an actuator according to a fifth exemplary embodiment of the present invention.

Referring now to FIG. 10, this figure illustrates a top view of an exemplary heat removal system 200E with shutters 1000 moved by an actuator 1005 according to a fifth exemplary embodiment of the present invention. The shutters 1000 can be used when the heat removal system 200E is exposed to a cold environment. For example, the shutters 1000 can be closed in cold weather in order to reduce the convection cooling of the equipment. Thus, in cold weather, the convection cooling may be substantially reduced which allows the power of the electronic components to dissipate heat to the circuitry. This design can reduce the need for designing electronics to meet specifications over a large a range of temperatures.

The shutters 1000 can be moved by an actuator 1005. The actuator 1005 can comprise a motor such as a stepper motor or servo motor. Other motor types are not beyond the scope of the present invention. The actuator 1005 can be coupled to a temperature sensing device 1010 which may activate or deactivate actuator 1005. The temperature sensing device 1010 can comprise a hardwired device or it could comprise a programmable electronic device with memory. Other temperature sensing devices 1010, such as small computers, application specific integrated circuits (ASICs), and other similar devices are not beyond the scope of the present invention.

Figure 11:
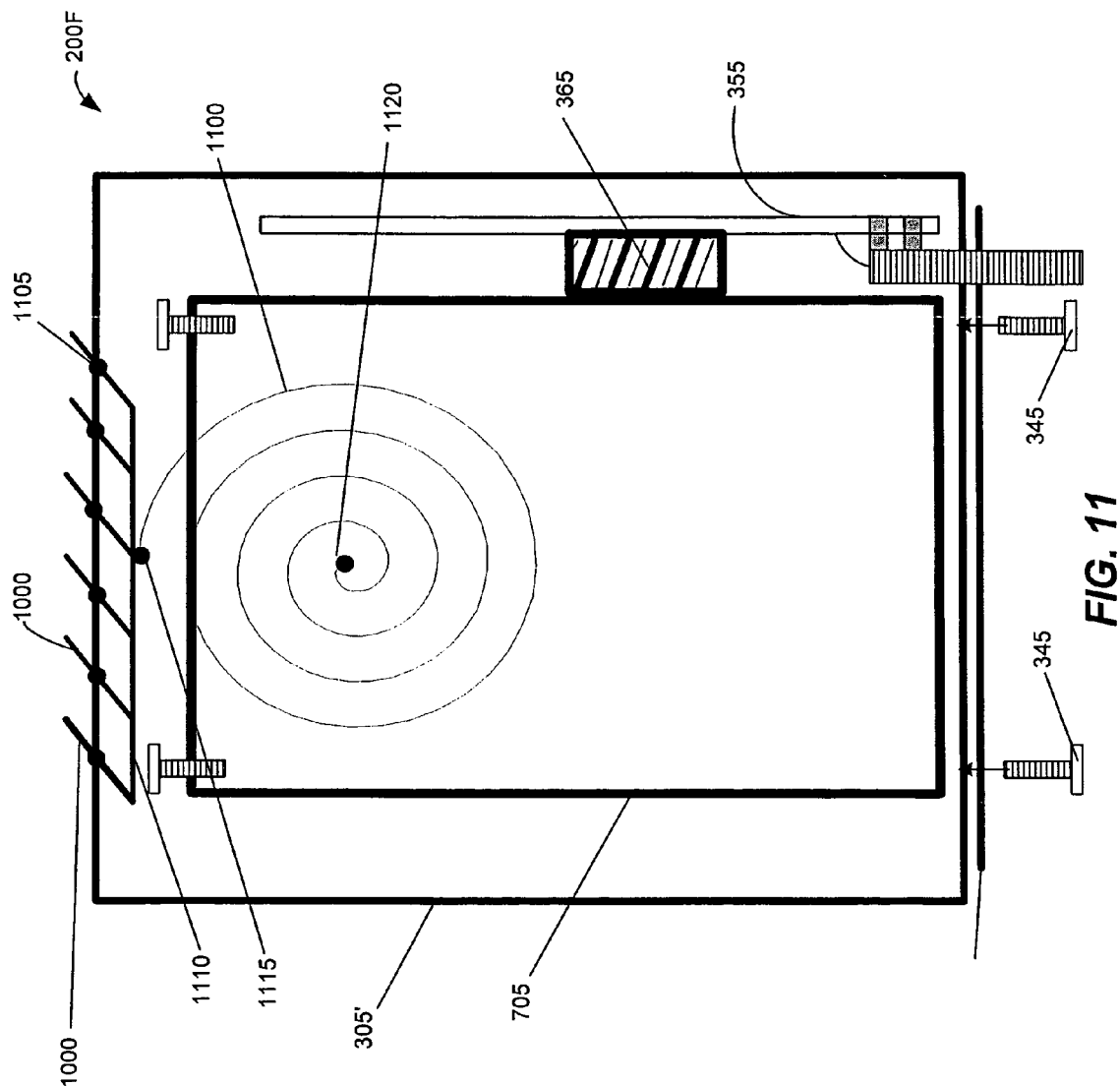
FIG. 11 is a cross-sectional view of an exemplary heat removal system with shutters controlled with a temperature sensitive spring according to a sixth exemplary embodiment of the present invention.

Referring now to FIG. 11, this Figure is a cross-sectional view of an exemplary heat removal system 200F with shutters 1000 controlled with a temperature sensitive spring 1100 according to a sixth exemplary embodiment of the present invention. In this exemplary embodiment, the actuator function and temperature sensing function have been combined through use of a bimetallic-temperature sensing spring 1100.

Further details of the shutters 1000 are also illustrated in FIG. 11. The shutters 1000 in one exemplary embodiment are similar in concept to a venetian blind. The shutters 1000 that can be rotated on hinges 1105 to either an open, vertical position (to allow fluid to circulate in a warmer environment) or a closed, horizontal position to block fluid flow through the heat dissipater column 705 (for cold environments). In FIG. 11, the shutters 1000 are depicted in a 45 degree position. An actuator bar 1110 can connect one edge of each shutter 1000, so that moving it will simultaneously open or close all the shutters 1000.

The bimetallic thermostat spring 1100 can be the type used with common mechanical thermostats. The spring 1100 can connected at a first end 1115 to the actuator bar 1110. At a second end 1120, the spring can be anchored to a side wall of the housing 305.

The thermostat spring 1100 is arranged such that it can open the shutters 1000 at higher temperatures and close the shutters 1000 at lower temperatures. The exact temperature at which the shutters 1000 open or close is not critical, but setting the spring 1100 such that the shutters 1000 are completely closed at about 32 degrees Fahrenheit is a convenient and a particularly useful magnitude.

The shutters 1000 and thermostat can be placed on either side of the housing 305 and heat dissipater column 705, as they can be effective to break up air flow moving through the heat removal system 200F. The shutters 1000 and actuators such as either the spring 1100 or actuator 1005 can be employed with any of the previous embodiments, even in the embodiments where the heat removal system 200 uses a surface of the structure 205 to form a part of the chimney structure as illustrated in FIGS. 2-5.

Exemplary Processes for Removing Heat from a Subscriber Optical Interface

Certain steps in the processes described below must naturally precede others for the present invention to function as described. However, the present invention is not limited to the order of the steps described if such order or sequence does not alter the functionality of the present invention. That is, it is recognized that some steps may be performed before or after other steps without departing from the scope and spirit of the present invention. Further, it is also recognized that some steps may be performed in parallel with other steps without departing from the scope and spirit of the present invention.

Figure 12:
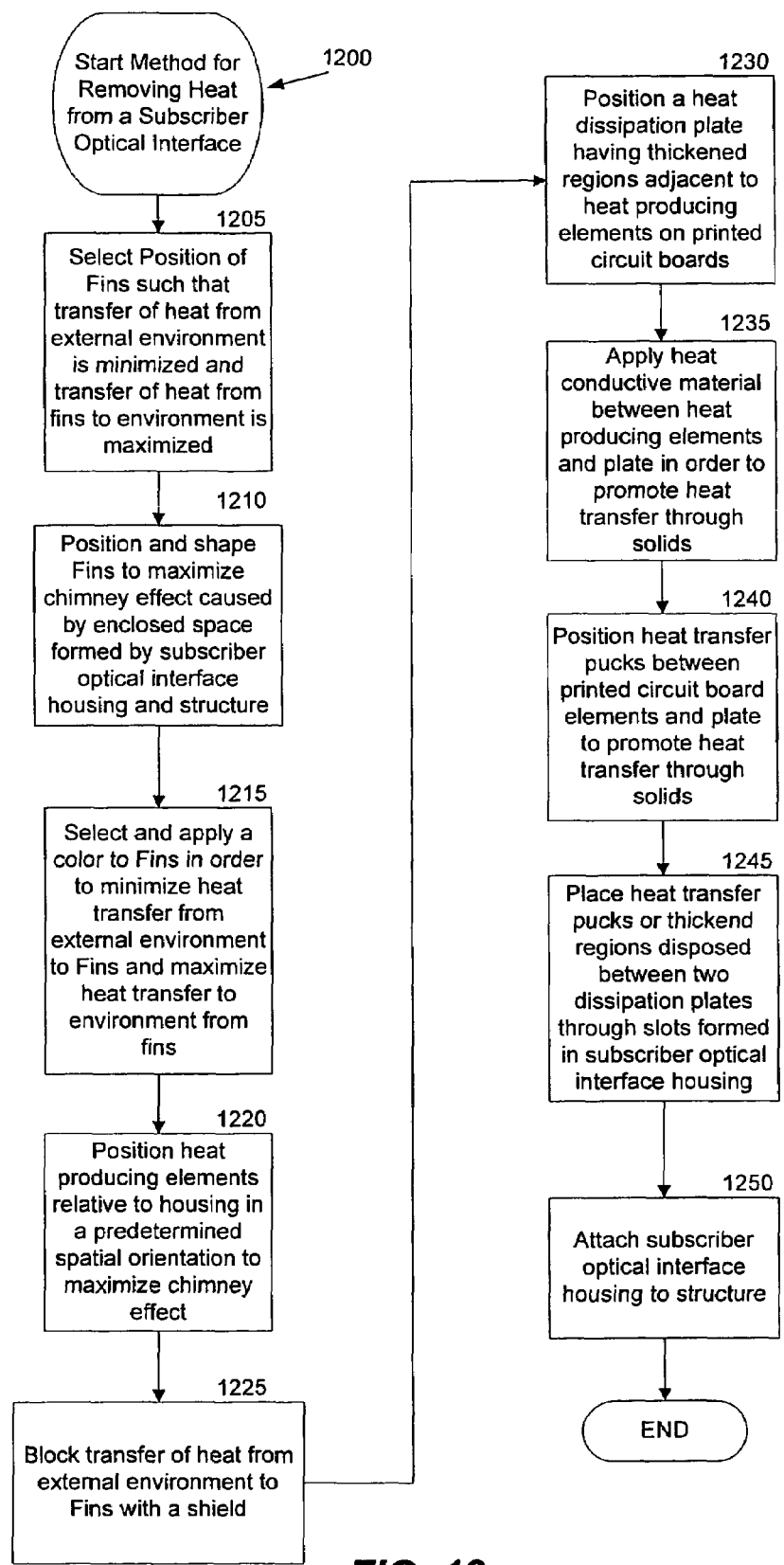
FIG. 12 is a logic flow diagram illustrating an exemplary process for removing heat from a subscriber optical interface housing according to exemplary embodiments of the present invention which use a portion of a structure outside of the housing to form a chimney structure.

Referring now to FIG. 12, this figure is a logic flow diagram illustrating an exemplary process 1200 for removing heat from a subscriber optical interface housing 305 according to exemplary embodiments of the present invention which use a portion of a structure outside of the housing to form a chimney structure such as in FIGS. 2-5.

Step 1205 is the first step of the process 1200. In Step 1205, a position of the fins 315 can be selected such that the transfer of heat from the external environment outside the housing 305 is minimized and transfer of heat from the fins 315 to the environment is maximized. In this step, the fins 315 can be positioned between the housing 305 and a structure 205 in order to substantially reduce or eliminate sunlight from striking the fins 315.

In Step 1210, the fins 315 can be shaped and positioned to maximize a chimney effect caused by an enclosed space 357 formed by the subscriber optical interface housing 305 and a structure 205. The fins 315 can be triangularly shaped and positioned along the housing 305 to maximize the transfer of heat from the housing 305 into the enclosed space 357.

Next in step 1215, a color can be selected and applied to the fins 315 in order to minimize heat transfer from the external environment to the fins 315 and to maximize heat transfer from the fins 315 to the external environment. Specifically, the top portions 317 of the fins 315 can be colored a reflective color such as white while the lower portions 317 can be colored a color that promotes heat radiation such as black.

In step 1220, the printed circuit boards 355 can be positioned relative to the housing 305 in a predetermined manner in to order to maximize a chimney effect. Specifically, first heat producing elements 365(1) disposed on a first PCB 355A that produce more heat than second heat producing elements 365(2) of a second PCB 355B can be positioned below the second heat producing elements 365 (2).

In Step 1225, any heat transfer from the external environment relative to the fins 315 can be blocked with shield 410. The shield 410 can be formed integral with the fins 315 and can be positioned to face the structure 205.

In Step 1230, a heat dissipation plate 310 having a thickened region 415 can be positioned adjacent to the heat producing elements 365 disposed on the printed circuit boards 355. In this way, any heat transfer from the heat producing elements 365 through fluid to the fins 315 can be substantially reduced or eliminated.

In Step 1235, a heat conductive material 320 can be applied between the heat producing elements 365 and the heat dissipation plate 310 in order to maximize heat transfer from the heat producing elements 365 to the fins 315. Specifically, heat conductive material 320 can be applied between the heat dissipater plate 310 and the heat producing elements 365 disposed on the printed circuit board 355.

In Step 1240, a heat transfer puck 420 can be positioned between the heat producing elements 365 and the heat dissipater plate 310 in order to conduct heat from the heat producing elements 365 to the heat dissipater plate 310. Specifically, heat transfer pucks 420 can be applied between the heat dissipater plate 310 and the heat producing elements 365 disposed on the printed circuit board 355.

In Step 1245, a heat transfer puck 420 or thickened region 415 can be placed between first and second heat dissipater plates 310A, 310B and through openings 500 formed in the subscriber optical interface housing 305. In this way, the heat transfer puck 420 or thickened region 415 can function as a heat transfer conduit that moves heat from the second heat dissipater plate 310B disposed within the housing 305 to the first heat dissipater plate 310A disposed outside the housing 305 and facing the structure 205.

In step 1250, the subscriber optical interface housing 305 can be attached to a structure 205 such as a house or office building. The process then ends.

Figure 13:
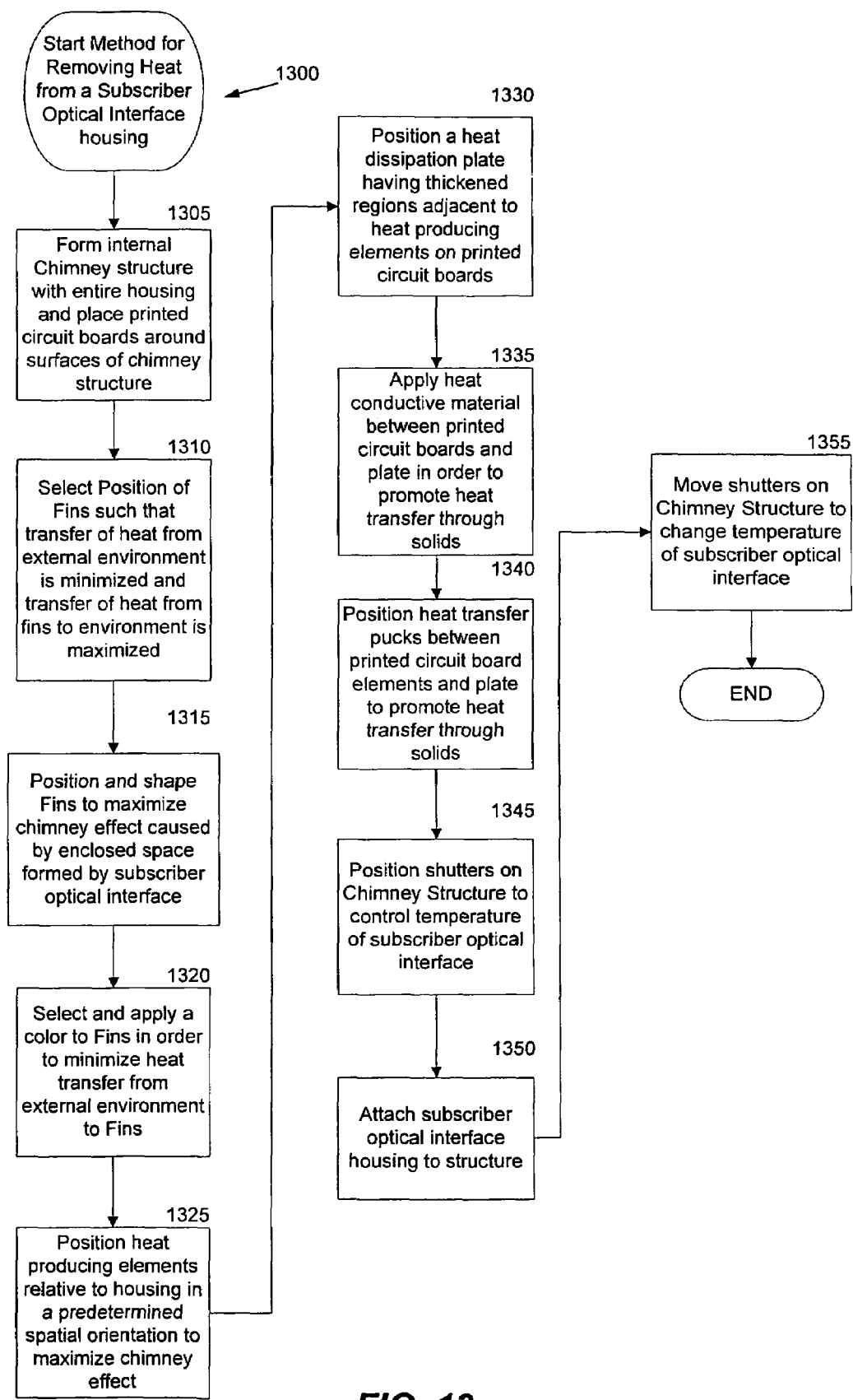
FIG. 13 is a logic flow diagram illustrating an exemplary process for removing heat from a subscriber optical interface housing according to exemplary embodiments of the present invention in which an internal chimney structure is formed by the housing.

Referring now to FIG. 13, this figure is a logic flow diagram illustrating an exemplary process 1300 for removing heat from a subscriber optical interface housing 305 according to exemplary embodiments of the present invention in which an internal chimney structure is formed by the housing 305 as illustrated in FIGS. 6-11.

Step 1305 is the first step of process 1300. In Step 1305, an internal chimney structure is formed with an entire housing 305 and printed circuit boards 355 are placed around the surfaces of the chimney structure. Specifically, a heat dissipater column 705 can be formed and a housing 305 can be designed to enclose the outside surface of the heat dissipater column 705.

In Step 1310, a position of the fins 315 can be selected such that the transfer of heat from the external environment outside the housing 305 into the housing 305 through the fins 315 is minimized and transfer of heat from the fins 315 to the environment is maximized. In this step, the fins 315 can be positioned within the heat dissipater column 705 which is sheltered from the structure 205.

In Step 1315, the fins 315 can be shaped and positioned to maximize a chimney effect caused by an enclosed space 357 formed by the subscriber optical interface housing 305 and heat dissipater column 705. The fins 315 can be triangularly shaped and positioned along the housing 305 to maximize the transfer of heat from the housing 305 into the enclosed space 357.

In Step 1320, a color can be selected and applied to the fins 315 in order to minimize heat transfer from the external environment to the fins 315 and to maximize heat transfer from the fins 315 to the external environment. Specifically, the top portions 317 of the fins 315 can be colored a reflective color such as white while the lower portions 317 can be colored a color that promotes heat radiation such as black.

In Step 1325, the printed circuit boards 355 can be positioned relative to the housing 305 in a predetermined manner in order to maximize the chimney effect of the heat dissipater column 705. Specifically, first heat producing elements 365(1) disposed on a first PCB 355A that produce more heat than second heat producing elements 365(2) of a second PCB 355B can be positioned below the second heat producing elements 365(2).

In Step 1330, a heat dissipation plate 310 that is part of the heat dissipater column 705 can have thickened region 415 positioned adjacent to the heat producing elements 365 disposed on the printed circuit boards 355. In this way, any heat transfer from the heat producing elements 365 to the fins 315 can be maximized.

In Step 1335, a heat conductive material 320 can be applied between the heat producing elements 365 and heat dissipater plate 310 in order to maximize heat transfer through solid structures. Specifically, heat conductive material 320 can be applied between a heat dissipater plate 310 that is part of the heat dissipater column 705 and the heat producing elements 365 disposed on each printed circuit board 355.

In Step 1340, a heat transfer puck 420 can be positioned between a heat producing element 365 and a heat dissipater plate 310 in order to maximize heat transfer through solid structures such as the puck 420. Specifically, heat transfer pucks 420 can be applied between a heat dissipater plate 310 that is part of the heat dissipater column 705 and the heat producing elements 365 disposed on the printed circuit board 355.

In Step 1345, shutters 1000 can be positioned on the chimney structure formed by the heat dissipater column 705 in order to control a temperature of the subscriber optical interface 140. In Step 1350, the subscriber optical interface housing 305' can be attached to a structure 205.

In step 1355, the shutters 1000 can be moved to change the temperature of the subscriber optical interface 140. Specifically, an actuator 1005 or a temperature sensitive spring 1100 can move the shutters 1000 from a first position to a second position in order to change temperature within the housing 305. After step 1360, the process can end.

Alternative Exemplary Embodiments

As noted above, the present invention is not limited to removing heat for only subscriber optical interface housings. The present invention can remove heat for electrical power boxes, telephone cabinets, cable TV cabinets, and other similar devices. The present invention is also not limited to environments such as outdoors. The present invention can function properly within a structure such as a house or building. Further, the present invention could be used below sea level meaning that heat from the fins could be transferred to a fluid such as water instead of air.

With the present invention, a heat transfer system for relatively small enclosures such as for housings of subscriber interfaces is provided. The system can remove heat produced by electronics positioned within the enclosure in an efficient manner. The system substantially reduces or eliminates heat transfer from the external environment to inside the enclosure of the subscriber interface. The small heat removal system efficiently removes heat from the inside of an enclosure and meanwhile, is aesthetically pleasing to the subscriber.

The invention being thus described, it will be obvious that the same may be varied in many ways. Such variations are not to be regarded as a departure from the spirit and scope of the invention, and all such modifications as would be obvious to one skilled in the art were intended to be included within the scope of the following claims.

What is claimed is:

1. A heat control system comprising:
   a housing comprising an internal cavity;
   a heat dissipater column enclosing the internal cavity, for regulating temperature of the internal cavity in response to airflow through the heat dissipater column;
   a shutter, coupled to the heat dissipater column, for regulating the airflow through the heat dissipater column; and
   fins disposed in the heat dissipater column for transferring heat from within the housing to the airflow in the heat dissipater column.

2. The heat control system of claim 1, wherein the shutter is disposed at an end of the heat dissipater column.

3. The heat control system of claim 1, wherein a chimney effect contributes to the airflow.

4. The heat control system of claim 1, further comprising an actuator for moving the shutter, wherein regulating the airflow comprises regulating convection.

5. The heat control system of claim 1, further comprising a temperature sensing device operative to control the shutter.

6. The heat control system of claim 1, further comprising a bimetallic strip that moves the shutter in response to temperature change.

7. The heat control system of claim 1, further comprising a spring operative to open the shutter in response to an increase in ambient temperature.

8. The heat control system of claim 1, further comprising a motor that actuates the shutter.

9. A heat control system, comprising:
   a housing, for a communication system, comprising an opening operable to emit heat that the communication system produces;

a cover positioned over at least a portion of the opening;

an actuator, coupled to the cover, operable to move the cover in response to a change in temperature;

a sensing device, coupled to the actuator, operable to sense the change in temperature; and fins disposed in the opening for transferring heat from communication system to air flowing through the opening.

10. The system of claim 9, wherein the opening comprises a chimney structure.

11. The system of claim 9, wherein emitting the heat comprises air flowing through the opening and wherein moving the cover comprises changing the air flowing through the opening.

12. The system of claim 9, wherein the cover comprises a shutter.

13. The system of claim 9, wherein the actuator comprises a motor.

14. The system of claim 9, wherein the sensing device comprises a programmable device with memory.

15. A method for temperature control of a communication device, comprising the steps of:

sensing a temperature;

if the sensed temperature is above a level, opening a window of a housing for holding the communication device, and emitting heat through the window;

transferring heat from the communication device with fins to airflow in the window when the window is opened; and if the sensed temperature is below the level, closing the window and containing the heat within the housing.

16. The method of claim 15, further comprising the step of converting thermal energy into mechanical motion, wherein opening the window comprises moving an object occluding at least a portion of the window via the mechanical motion.

17. The method of claim 16, wherein converting thermal energy into mechanical motion comprises a bimetallic member expanding or contracting in response to a change in the temperature and wherein moving the object comprises the expansion or contraction of the bimetallic member moving the object.

18. The method of claim 15, wherein:

the housing encloses the communication device and comprises a chimney;

opening the window comprises increasing airflow through the chimney; and closing the window comprises decreasing airflow through the chimney.

19. The method of claim 18, further comprising the step of transferring heat associated with the communication device to the chimney.

20. The method of claim 15, wherein the sensing step comprises sensing the temperature of an operating environment of the housing.

21. A method for regulating temperature of an enclosure, comprising the steps of:

conducting heat from the enclosure to a tube by using fins positioned within the tube and exposed to airflow through the tube;

sensing a temperature associated with the enclosure;

providing airflow through the tube via convection if the temperature is above a level; and restricting the airflow through the tube if the temperature is below the level.

22. The method of claim 21, wherein providing the airflow comprises opening a shutter and wherein restricting the airflow comprises closing the shutter.

23. The method of claim 21, wherein restricting the airflow comprises occluding the tube.

24. The method of claim 21, wherein the restricting step comprises:

producing a dimensional change in a first member in response to a change in the temperature;

the dimensional change in the first member moving a second member; and the second member restricting the airflow in response to the movement of the first member.

25. The method of claim 21, wherein the providing step further comprises:

expanding a bimetallic strip in response to an increase in the temperature; and moving an obstruction of the tube in response to expanding the bimetallic strip.

26. The method of claim 21, wherein providing the airflow comprises rotating a member, disposed in the tube, about a hinge.

27. The method of claim 21, further comprising the step of heating an internal space with a communication device contained within the enclosure in response to restricting the airflow.

* * * * *